(12) United States Patent
Kanno et al.

(10) Patent No.: US 9,093,144 B2
(45) Date of Patent: *Jul. 28, 2015

(54) SEMICONDUCTOR MEMORY DEVICE

(71) Applicant: KABUSHIKI KAISHA TOSHIBA, Minato-ku (JP)

(72) Inventors: Hiroshi Kanno, Yokkaichi (JP); Yoichi Minemura, Yokkaichi (JP); Takayuki Tsukamoto, Yokkaichi (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 57 days.

This patent is subject to a terminal disclaimer.

(21) Appl. No.: 14/026,258

(22) Filed: Sep. 13, 2013

(65) Prior Publication Data
US 2014/0211539 A1 Jul. 31, 2014

Related U.S. Application Data

(60) Provisional application No. 61/757,887, filed on Jan. 29, 2013.

(30) Foreign Application Priority Data

Jul. 22, 2013 (JP) ................................. 2013-151326

(51) Int. Cl.
    *G11C 11/00* (2006.01)
    *G11C 13/00* (2006.01)
    *H01L 27/24* (2006.01)

(52) U.S. Cl.
CPC .......... *G11C 13/004* (2013.01); *G11C 13/0064* (2013.01); *G11C 13/0069* (2013.01); *H01L 27/2409* (2013.01); *H01L 27/249* (2013.01); *G11C 13/0002* (2013.01); *G11C 13/0004* (2013.01); *G11C 13/0007* (2013.01); *G11C 2013/009* (2013.01); *G11C 2013/0076* (2013.01); *G11C 2213/71* (2013.01); *G11C 2213/72* (2013.01)

(58) Field of Classification Search
CPC ............... G11C 13/0002; G11C 16/26; G11C 2213/72; G11C 2213/77; G11C 11/1653; G11C 13/0023; G11C 13/0009; G11C 2213/53; G11C 13/0004; G11C 13/0097
USPC ............. 365/148, 158, 163, 189.011, 189.15, 365/189.16
See application file for complete search history.

(56) References Cited

U.S. PATENT DOCUMENTS

2007/0070710 A1   3/2007   Takenaka
2010/0315857 A1* 12/2010  Sonehara et al. ............. 365/148

(Continued)

FOREIGN PATENT DOCUMENTS

JP    2000-100184    4/2000
JP    2007-95131      4/2007

(Continued)

*Primary Examiner* — Fernando Hidalgo
(74) *Attorney, Agent, or Firm* — Oblon, McClelland, Maier & Neustadt, L.L.P.

(57) ABSTRACT

A control circuit is configured to perform, when a plurality of variable resistance elements connected to a selected first wiring line are selected, a read operation to sense a voltage of the selected first wiring line. The control circuit is configured to adjust, according to the voltage of the selected first wiring line sensed in the read operation, a voltage to be applied to the selected first wiring line in a reset operation or a set operation. The reset operation is an operation to increase resistance of a variable resistance element. The set operation is an operation to decrease resistance of a variable resistance element.

16 Claims, 21 Drawing Sheets

(56) References Cited

U.S. PATENT DOCUMENTS

2013/0100726 A1* 4/2013 Yi et al. .................. 365/148
2013/0148400 A1* 6/2013 Murooka .................. 365/63

FOREIGN PATENT DOCUMENTS

| JP | 2008-262613 | 10/2008 |
| JP | 2009-301691 | 12/2009 |

* cited by examiner

|  | 1ST TIME | 2ND TIME | I_BL |
|---|---|---|---|
| case 1 | 0 | Don't care | < 10uA |
| case 2 | 1 | 0 | 10~30uA |
| case 3 | 1 | 1 | > 30uA |

BEFORE S201-A

AFTER YES IN S206-A

△ : MEMORY CELL COMPRISING VARIABLE RESISTANCE ELEMENTS IN LOW RESISTIVE STATE

▲ : MEMORY CELL COMPRISING VARIABLE RESISTANCE ELEMENTS IN HIGH RESISTIVE STATE

SEMICONDUCTOR MEMORY DEVICE

CROSS-REFERENCE TO RELATED APPLICATIONS

This application is based upon and claims the benefit of priority from the prior U.S. provisional Patent Application No. 61/757,887, filed on Jan. 29, 2013, and Japanese Prior Patent Application 2013-151326, filed on Jul. 22, 2013, the entire contents of which are incorporated herein by reference.

FIELD

The embodiments described herein relate to a semiconductor memory device.

BACKGROUND

A memory cell has been proposed that includes a variable resistance element of which the resistance is changed by voltage application. The memory cell is provided between a bit-line and a word-line. Applying some voltage to a selected bit-line and a selected word-line, a selected voltage is applied to the variable resistance element.

Unfortunately, according to the state (resistance) of the variable resistance element connected to the selected bit-line BL, the voltage of the selected bit-line BL changes. Therefore, the sufficient voltage may not be applied to the selected bit-line BL, and thus the resistance of the variable resistance element may remain unchanged.

DETAILED DESCRIPTION

Semiconductor memory devices according to the embodiments described below each include a memory cell array and a control circuit. The memory cell array includes a plurality of first wiring lines, a plurality of second wiring lines, and a plurality of memory cells disposed at the intersections of the first and second wiring lines, each memory cell comprising a variable resistance element. The control circuit is configured to perform, when a plurality of variable resistance elements connected to a selected first wiring line is selected, a read operation to sense a voltage of the selected first wiring line. The control circuit is configured to adjust, according to the voltage of the selected first wiring line sensed in the read operation, the voltage to be applied to the selected first wiring line in a reset operation or a set operation. The reset operation is an operation to increase the resistance of the variable resistance element. The set operation is an operation to decrease the resistance of the variable resistance element.

First Embodiment

Figure 1:
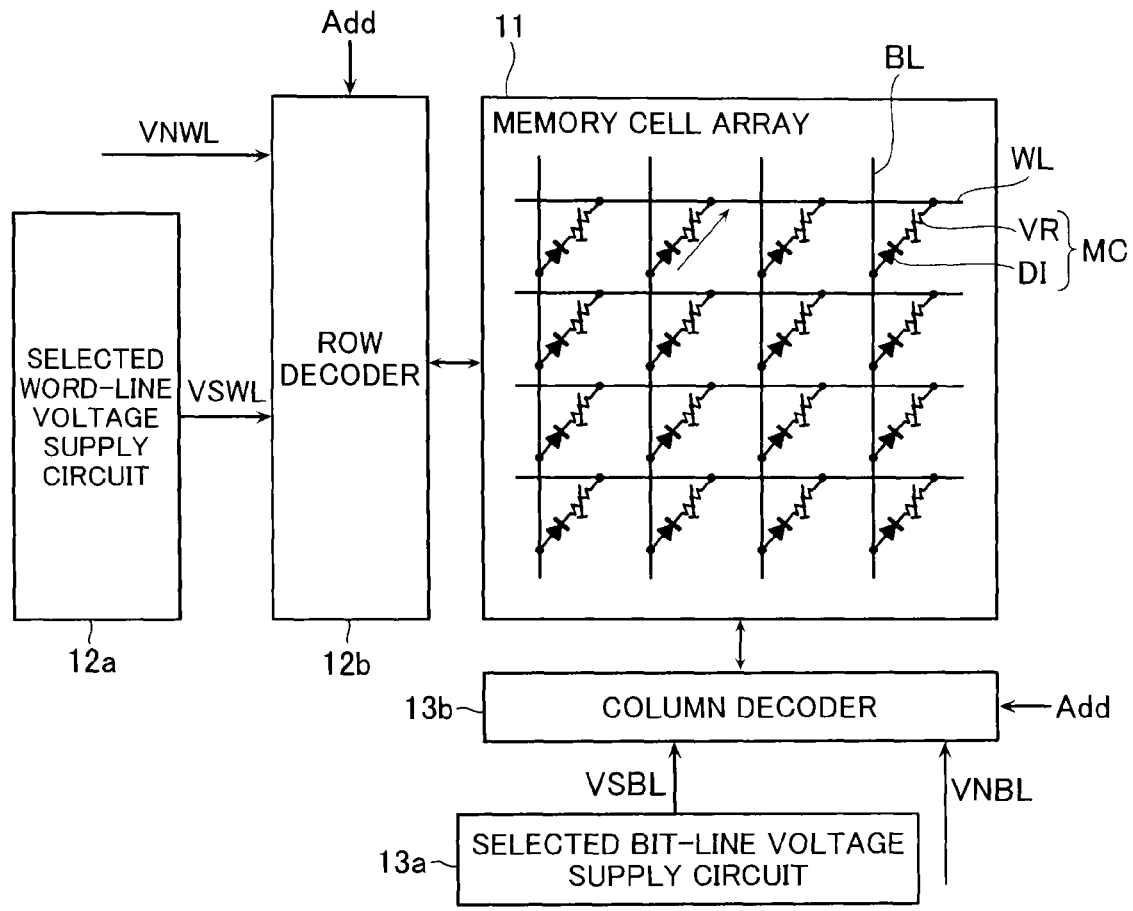
FIG. 1 is an example block diagram of a semiconductor memory device according to a first embodiment.

FIG. 1 is an example block diagram of a semiconductor memory device according to a first embodiment. With reference to FIG. 1, the semiconductor memory device according to the first embodiment includes a memory cell array 11, a selected word-line voltage supply circuit 12a, a row decoder 12b, a selected bit-line voltage supply circuit 13a, and a column decoder 13b.

The memory cell array 11 includes word-lines WL, bit-lines BL intersecting the word-lines WL, and memory cells MC disposed at the intersections of the bit-lines BL and the word-lines WL. Each memory cell MC includes a diode DI and a variable resistance element VR, which are connected in series. The forward direction of the diode DI is a direction from a bit-line BL to a word-line WL. The diode DI may reduce a sneak current when electrically accessed.

The selected word-line voltage supply circuit 12a supplies a selected word-line voltage VSWL to the row decoder 12b. The selected bit-line voltage supply circuit 13a supplies a selected bit-line voltage VSBL to the column decoder 13b. Each of the row decoder 12b and the column decoder 13b is given an address signal Add. In addition, according to the address signal Add, the row decoder 12b supplies the selected word-line voltage VSWL to a selected word-line WL and supplies a non-selected word-line voltage VNWL to a non-selected word-line WL. According to the address signal Add, the column decoder 13b supplies the selected bit-line voltage VSBL to a selected bit-line BL and supplies a non-selected bit-line voltage VNBL to a non-selected bit-line BL. Thus, the selected word-line WL and the selected bit-line BL are applied with predetermined voltages, thereby performing a set operation or a reset operation to a memory cell MC. The set operation is an operation to shift the variable resistance element VR in a memory cell MC from a high resistive state (reset state) to a low resistive state (set state). The reset operation is an operation to shift the variable resistance element VR from the low resistive state (set state) to the high resistive state (reset state).

Figure 2:
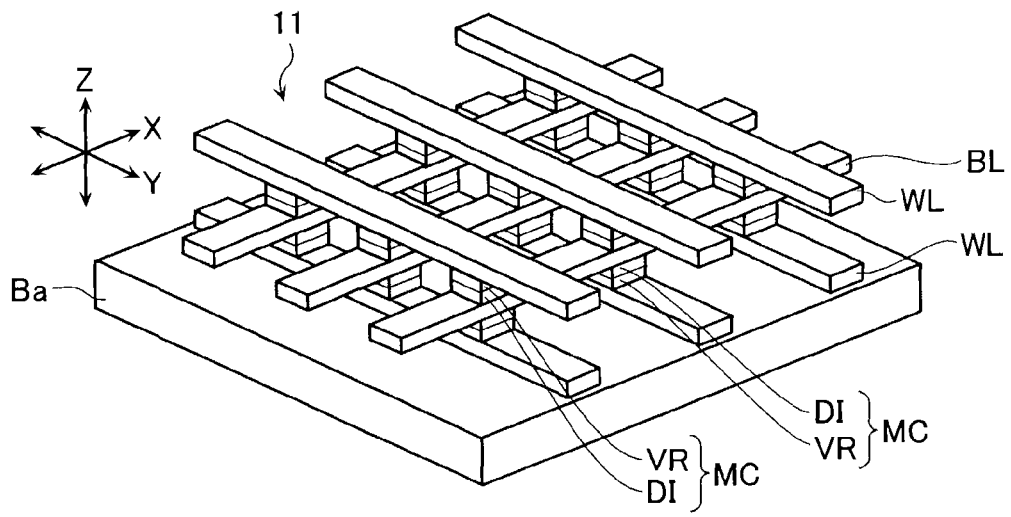
FIG. 2 is an example perspective view showing a portion of a memory cell array 11 according to the first embodiment.

FIG. 2 is an example perspective view showing a portion of the memory cell array 11. The word-lines WL are disposed at a predetermined pitch in the X direction parallel to the principal plane of a semiconductor substrate Ba. The word-lines WL extend in the Y direction. The bit-lines BL are disposed at a predetermined pitch in the Y direction and intersect the word-lines WL. The bit-lines BL extend in the X direction. The memory cells MC are disposed at the intersections of the word-lines WL and the bit-lines BL and connected between the word-lines WL and the bit-lines BL. The memory cells MC that are arranged in the Z direction perpendicular to the substrate Ba share the bit-line BL disposed therebetween.

Preferably, the bit-lines BL and the word-lines WL are made of materials that have thermal resistance and low resistivity such as tungsten (W), titanium (Ti), tantalum (Ta), and nitride or a stack thereof. For example, the bit-lines BL and the word-lines WL are repeated at a pitch of 40 nm. That is, the bit-lines BL and the word-lines WL have a width of 20 nm and a space of 20 nm.

The variable resistance element VR may include PCRAM, CBRAM, ReRAM or the like as described below. The PCRAM, such as chalcogenide, changes its resistance by phase transition between the crystalline state and the amorphous state. The CBRAM changes its resistance by precipitation of metal cations that forms cross-linking (conducting bridge) between electrodes, or by ionization of the precipitated metals that breaks down the cross-linking. The ReRAM changes its resistance by voltage or current application. The ReRAM is broadly classified: one changing its resistivity by the presence or absence of a charge trapped by a charge trap present at an electrode interface, and the other changing its resistivity by the presence or absence of a conductive path due to oxygen deficiency or the like.

Figure 3A:
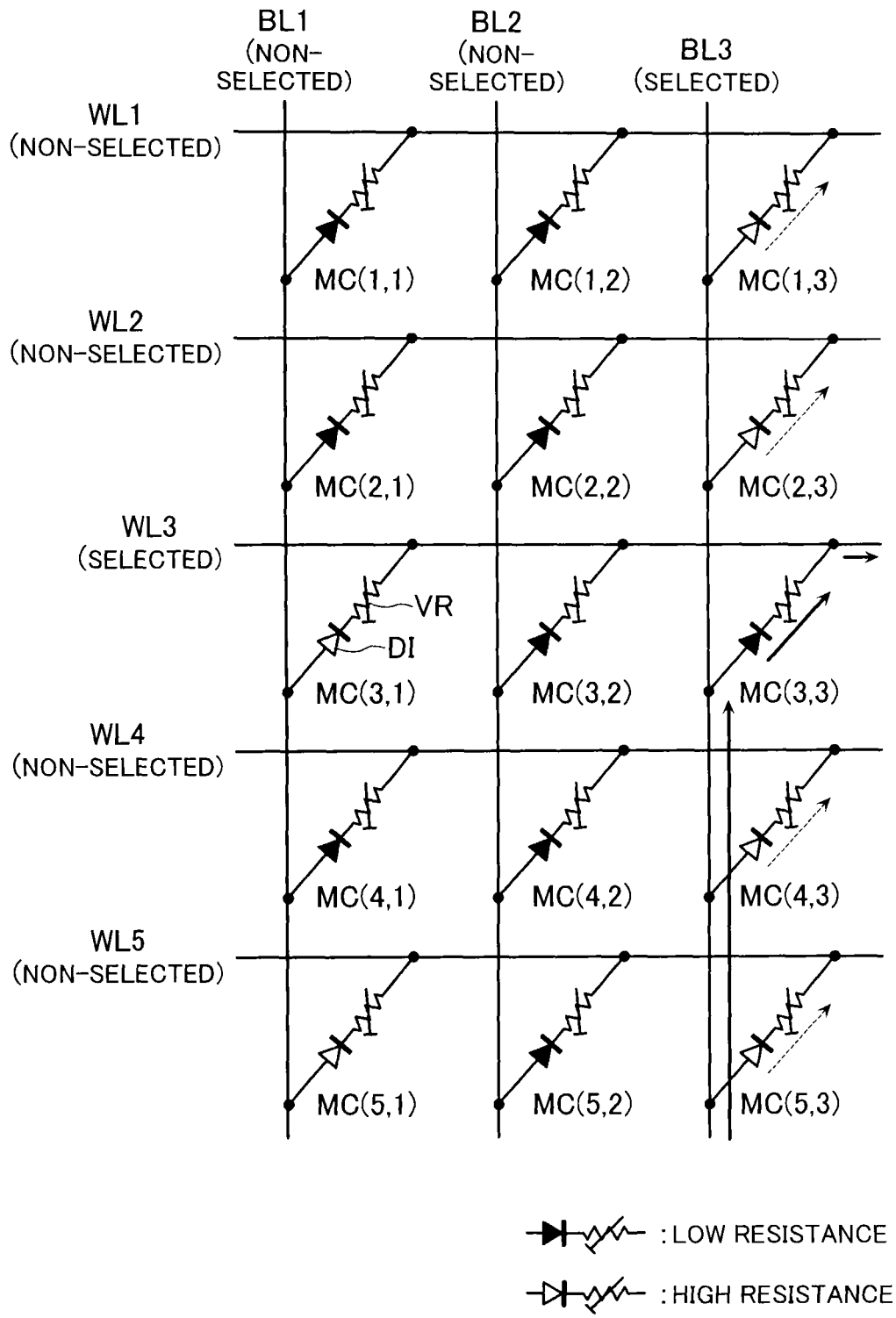
FIG. 3A is an example schematic diagram of current flowing from a selected bit-line BL3 to word-lines WL1 to WL5 in a reset operation.
Figure 3B:
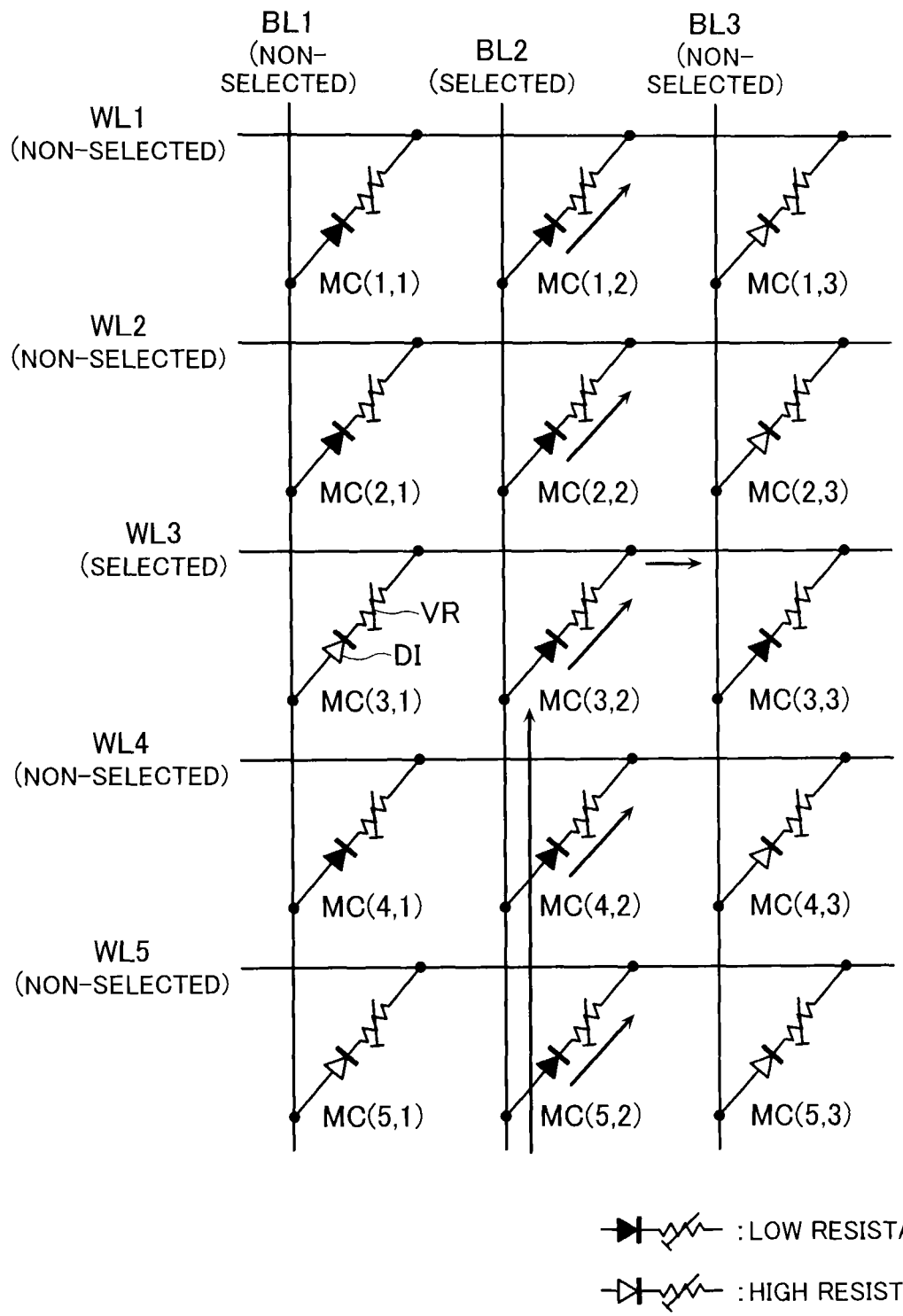
FIG. 3B is an example schematic diagram of current flowing from a selected bit-line BL2 to the word-lines WL1 to WL5 in the reset operation.

With reference now to FIG. 3A and FIG. 3B, a description is given of a problem on current flowing from a selected bit-line BL to the word-lines WL in the reset operation. Here, in FIGS. 3A and 3B, the variable resistance element VR connected to a white-painted diode DI is in the high resistive state (reset state). Meanwhile, the variable resistance element VR connected to a black-painted diode DI is in the low resistive state (set state). Then, FIGS. 3A and 3B show that the most elements VR on a bit-line BL2 are the variable resistance elements VR in the low resistive state, and the most elements VR on a bit-line BL3 are the variable resistance elements VR in the high resistive state.

FIG. 3A shows an example where in the reset operation, the bit-line BL3 and a word-line WL3 are selected and the selected memory cell MC (3, 3) provided therebetween is applied with a voltage. For example, the selected bit-line BL3 is set at a voltage of 8 V and the selected word-line WL3 is set at a voltage of 0 V. In addition, non-selected bit-lines BL1 and BL2 are set at a voltage of 2 V and non-selected word-lines WL1, WL2, WL4, and WL5 are set at a voltage of 6 V. FIG. 3A shows that the variable resistance elements VR in half-selected memory cells MC (1, 3), MC (2, 3), MC (4, 3), and MC (5, 3) connected to the selected bit-line BL3 are all in the high resistive state. Therefore, little leak current flows from the selected bit-line BL3 to the non-selected word-lines WL1, WL2, WL4, and WL5. Thus, the voltage applied to one end of the selected memory cell MC (3, 3) is generally the same as the voltage transferred to the selected bit-line BL3.

In contrast, FIG. 3B shows an example where in the reset operation, the bit-line BL2 and the word-line WL3 are selected and the selected memory cell MC (3, 2) provided therebetween is applied with a voltage. FIG. 3B shows that the variable resistance elements VR in half-selected memory cells MC (1, 2), MC (2, 2), MC (4, 2), and MC (5, 2) connected to the selected bit-line BL2 are all in the low resistive state. Therefore, leak current flows from the selected bit-line BL2 to the non-selected word-lines WL1, WL2, WL4, and WL5. Thus, the voltage applied to the selected bit-line BL connected to the selected memory cell MC (3, 2) is lower than the voltage transferred to the selected bit-line BL2.

As described above, with reference to FIGS. 3A and 3B, according to the resistive state of the variable resistance element VR on the selected bit-line BL, the voltage supplied to the selected bit-line BL connected to the selected memory cell MC changes. Therefore, a constant voltage transferred to the selected bit-line BL regardless of the resistive state of the variable resistance element VR may incorrectly perform the reset operation to the selected memory cell MC. In addition, the set operation may encounter a similar problem to the reset operation.

Figure 4:
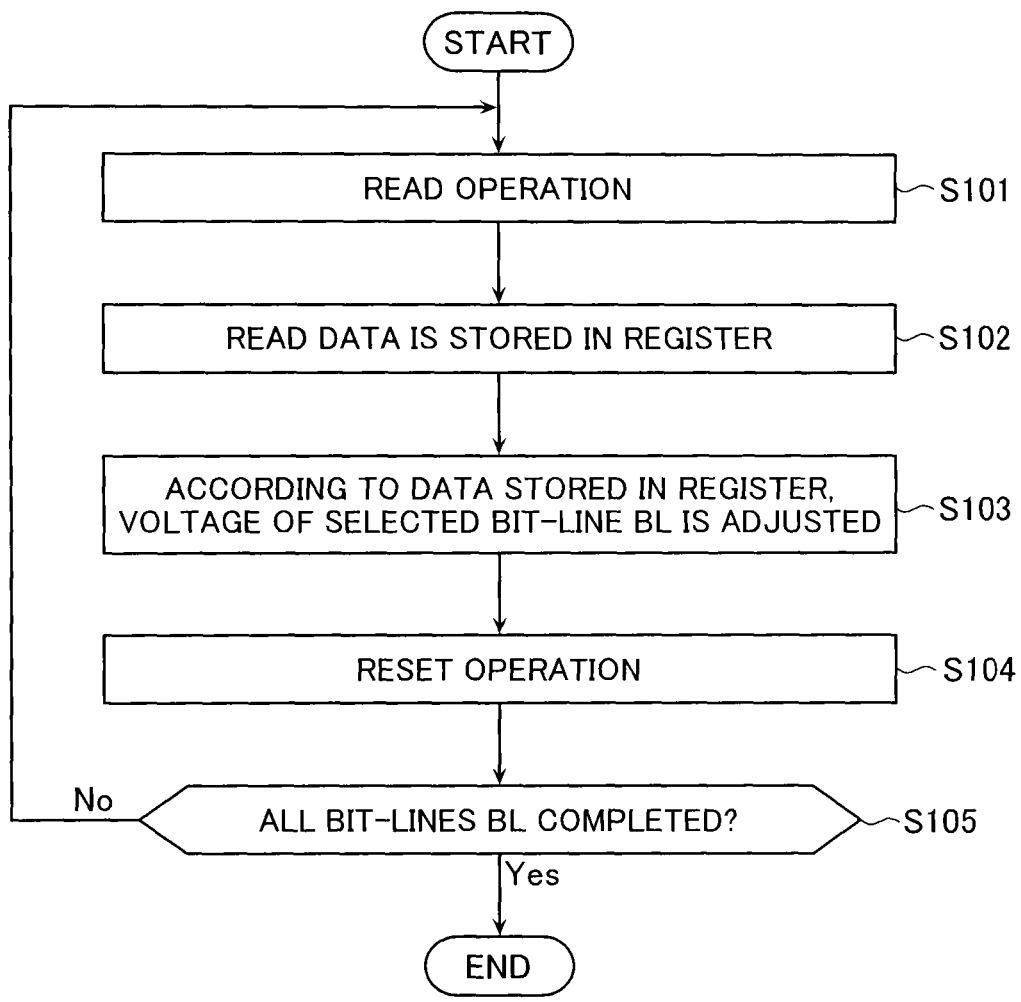
FIG. 4 is an example flowchart showing a read operation and the reset operation according to the first embodiment.

To solve the above problem, this embodiment performs the operation shown in FIG. 4, for example. With reference to FIG. 4, this embodiment performs, before the reset operation, a read operation to sense the voltage of the selected bit-line BL due to current flowing from the selected bit-line BL to the word-line WL via the variable resistance element VR (S101). The voltage of the selected bit-line BL changes depending on the resistive state of the variable resistance element VR connected to the selected bit-line BL. That is, voltages of selected bit-lines BL may differ among the bit lines BL. Then, the read data is stored in a register (S102). Then, according to data stored in the register, the voltage of the selected bit-line BL is adjusted (S103), and then the reset operation is performed (S104). Then, it is determined whether the processes from step S101 to S104 are completed to all bit-lines BL in the memory cell array 11 (S105). If the processes from step S101 to S104 are completed to all bit-lines BL (S105, Yes), then the operation is ended. Meanwhile, if the processes from step S101 to S104 are not completed yet to all bit-lines BL (S105, No), then the processes from step S101 are repeated.

Figure 5:
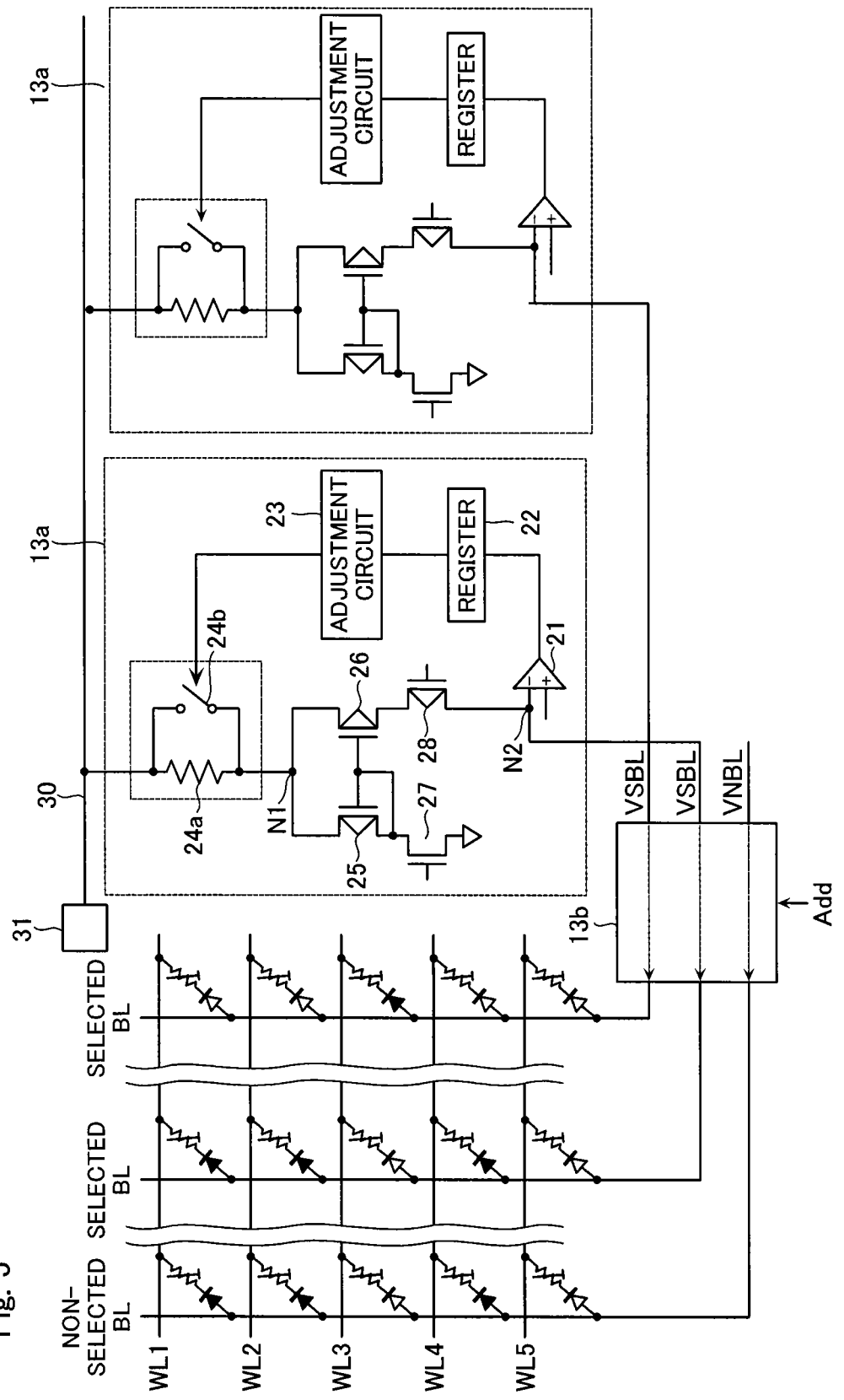
FIG. 5 is an example circuit diagram showing a selected bit-line voltage supply circuit 13a according to the first embodiment.

To perform the above control in FIG. 4, the selected bit-line voltage supply circuit 13a has a configuration as shown in FIG. 5. With reference to FIG. 5, the number of selected bit-line voltage supply circuits 13a provided is the same as the maximum number of bit-lines selected at the same time. The selected bit-line voltage supply circuits 13a are connected to the respective selected bit-lines BL via the column decoder 13b. The circuits 13a are commonly connected to a wiring line 30, which supplies voltages to the circuits 13a. Note that the wiring line 30 is connected to a power supply 31.

Each of the selected bit-line voltage supply circuits 13a includes a sense amplifier 21, a register 22, an adjustment circuit 23, a voltage drop adjustment circuit 24, and transistors 25 to 28. The sense amplifiers 21 have inverting input terminals connected to the respective bit-lines BL. The register 22 stores output data from the sense amplifier 21. The adjustment circuit 23 controls the voltage drop adjustment circuit 24 according to data in the register 22.

The voltage drop adjustment circuit 24 drops the voltage of the wiring line 30 and supplies the dropped voltage to the selected bit-line BL via the transistors 26 and 28. The voltage drop adjustment circuit 24 includes a resistor 24a and a switch 24b. The resistor 24a is connected between the wiring line 30 and a node N1. The switch 24b is connected in parallel with the resistor 24a.

The PMOS transistors 25 and 26 are current-mirror connected. The PMOS transistors 25 and 26 have gates connected to the drain of the PMOS transistor 25. The PMOS transistors 25 and 26 have sources connected to the node N1. The NMOS transistor 27 is connected between the drain of the PMOS transistor 25 and the ground terminal. The PMOS transistor 28 is connected between the drain of the PMOS transistor 26 and the inverting input terminal (node N2) of the sense amplifier 21.

Figure 6:
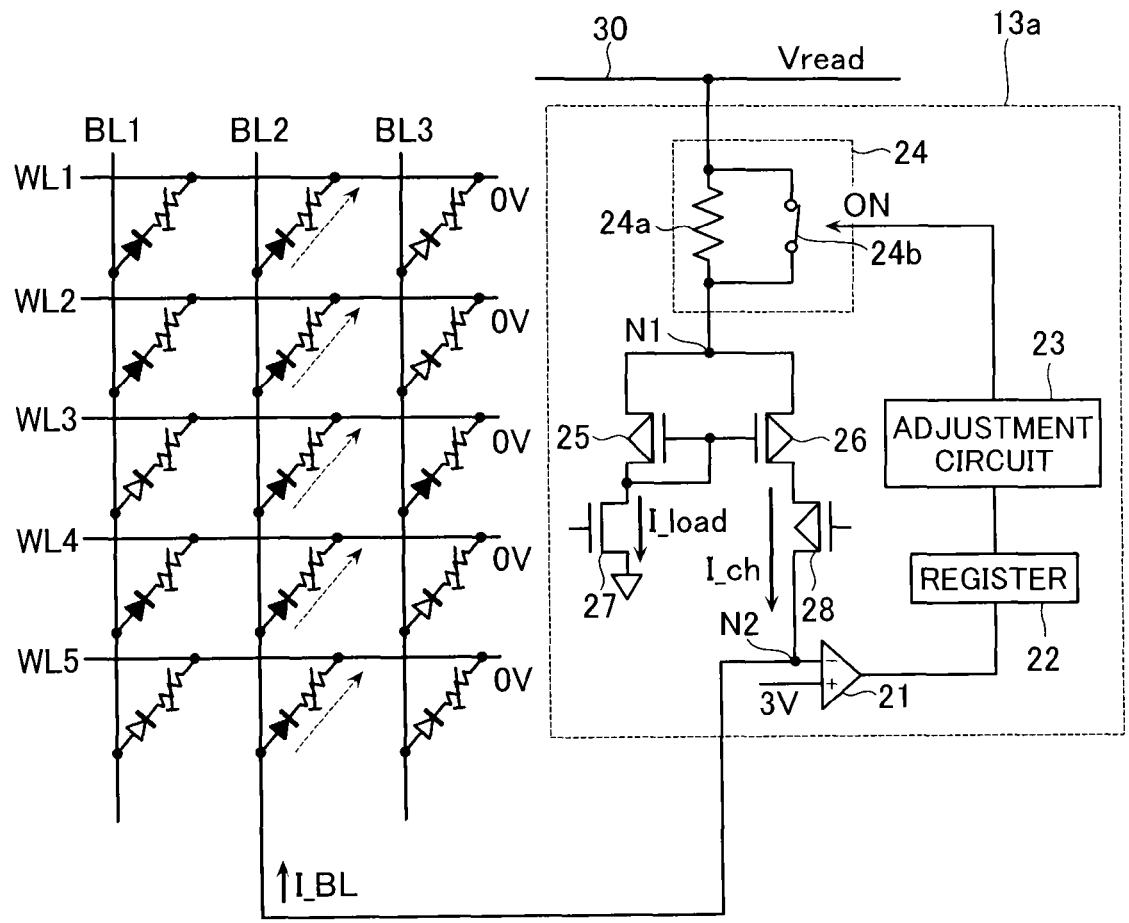
FIG. 6 is an example schematic diagram showing the read operation according to the first embodiment.
Figure 7:
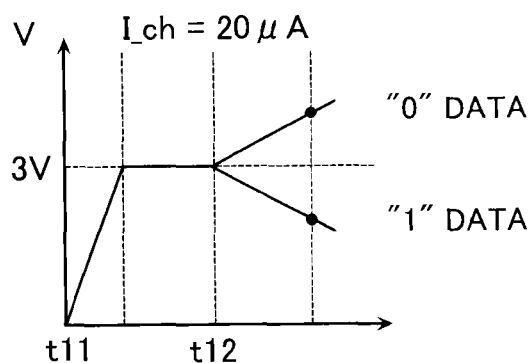
FIG. 7 is an example timing chart showing the read operation according to the first embodiment.

With reference now to FIGS. 6 and 7, a description is given of the read operation (step S101 in FIG. 4) of the selected bit-line voltage supply circuit 13a. FIG. 6 is an example schematic diagram showing the read operation of the selected bit-line voltage supply circuit 13a. FIG. 7 is an example timing chart showing the read operation of the selected bit-line voltage supply circuit 13a. Note that FIG. 6 omits the column decoder 13b and illustrates only one selected bit-line voltage supply circuit 13a.

With reference to FIG. 6, in the read operation, the wiring line 30 is applied with a read voltage Vread to turn conductive the switch 24b, the transistor 27, and the transistor 28 on. In addition, the non-inverting input terminal of the sense amplifier 21 is applied with the reference voltage (for example, 3 V). Then, with reference to time t11 in FIG. 7, the selected bit-line BL2 is charged to, for example, about 3 V. Note that along with the charging of the selected bit-line BL2, the word-lines WL1 to WL5 are also charged to, for example, about 3 V (not shown).

Then, the voltages of the word-lines WL1 to WL5 are reduced from 3 V to the ground voltage (0 V). That is, it means that all variable resistance elements VR connected to the selected bit-line BL2 are in the selected state. Note that "all variable resistance elements VR connected to the selected bit-line BL2" does not mean all variable resistance elements VR that are physically connected to the selected bit-line BL2. This phrase means the variable resistance elements VR applied with voltages in the set and reset operations, among the variable resistance elements VR physically connected to the selected bit-line BL2. Further, the gate voltage of the transistor 27 is adjusted to conduct current I_load through the transistor 27. With the current I_load, the transistor 26 draws current I_ch equal to the current I_load. The first embodiment sets the current I_ch to, for example, about 20 µA.

With the above control, the current (forward direction current of the diode DI) flowing from the selected bit-line BL2 to the word-lines WL1 to WL5 via the memory cells MC (1, 2) to MC (5, 2) determines the voltage at the node N2. The voltage value at the node N2 is sensed by the sense amplifier 21. If, the number of the variable resistance elements VR in the high resistive state is large on the selected bit-line BL2, the current I_BL is lower than the current I_ch, thus increasing the voltage at the node N2. Meanwhile, if, the number of the variable resistance elements VR in the low resistive state is large on the selected bit-line BL2, the current I_BL is higher than the current I_ch, thus decreasing the voltage at the node N2. With reference to time t12 in FIG. 7, the sense amplifier 21 outputs "0" data if the voltage of the selected bit-line BL2 is higher than the reference voltage (3 V) and outputs "1" data if the voltage of the selected bit-line BL2 is lower than the reference voltage. Then, the register 22 stores "0" or "1" data output from the sense amplifier 21. Then, the read operation is ended. As described below, according to data of the register 22, the voltage of the selected bit-line BL in the reset operation is adjusted.

Figure 8A:
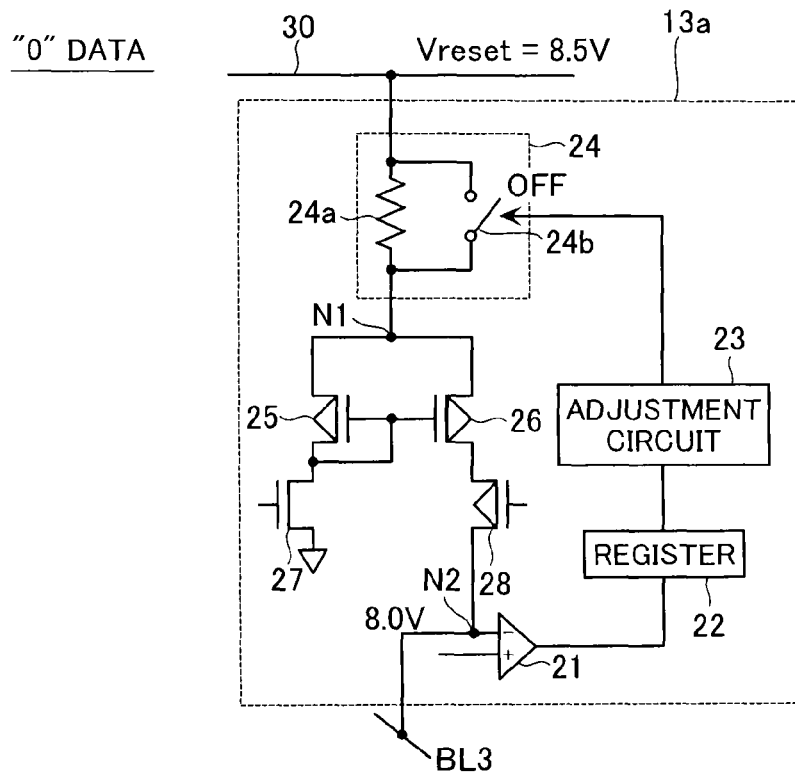
FIG. 8A is an example schematic diagram showing the reset operation according to the first embodiment.
Figure 8B:
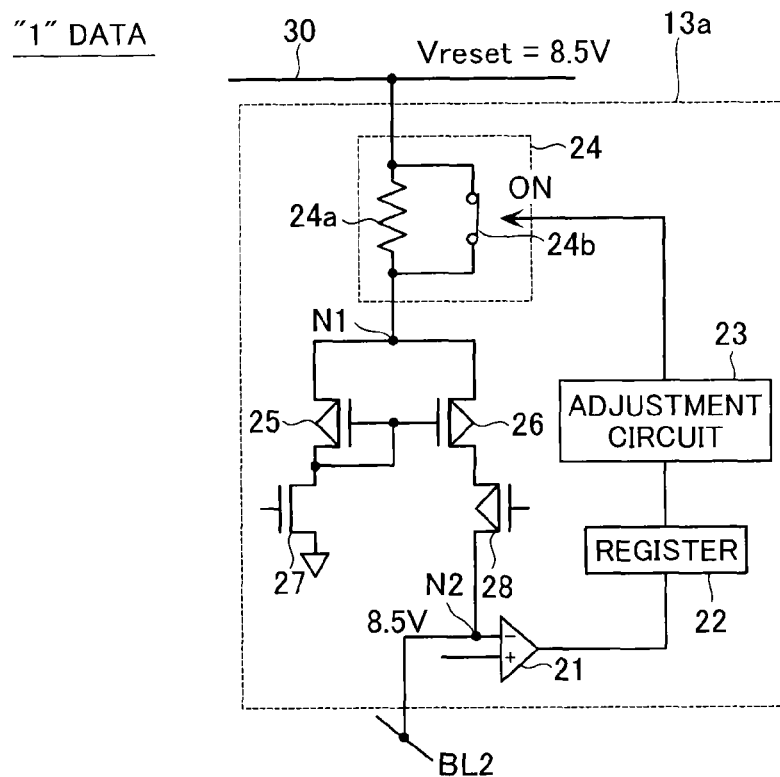
FIG. 8B is an example schematic diagram showing the reset operation according to the first embodiment.

With reference now to FIG. 8A and FIG. 8B, a description is given of the reset operation (step S104 in FIG. 4) of the selected bit-line voltage supply circuit 13a. FIGS. 8A and 8B are example schematic diagrams showing the reset operation of the selected bit-line voltage supply circuit 13a. Note that FIGS. 8A and 8B omit the column decoder 13b. In the reset operation, the adjustment circuit 23 reads data ("0" or "1") stored in the register 22 by the read operation, Furthermore, the adjustment circuit 23 adjusts the conduction state of the switch 24b according to the data. In addition, in the reset operation, the wiring line 30 is applied with a reset voltage Vreset (for example, 8.5 V), thus turning on the transistor 28. With reference to FIG. 8A, if "0" data is read, then the adjustment circuit 23 causes the switch 24b to turn off (OFF). Thus, a voltage (for example, 8 V) dropped from the reset voltage Vreset of the wiring line 30 through the resistor 24a is applied to the selected bit-line BL3. Meanwhile, with reference to FIG. 8B, if "1" data is read, then the adjustment circuit 23 causes the switch 24b to turn on (ON). Thus, the reset voltage Vreset (for example, 8.5 V) of the wiring line 30 is supplied to the selected bit-line BL2 without being dropped. Note that the voltage drop across the channel portions of the transistors 26 and 28 are very small with respect to the bit-line BL.

Figure 8C:
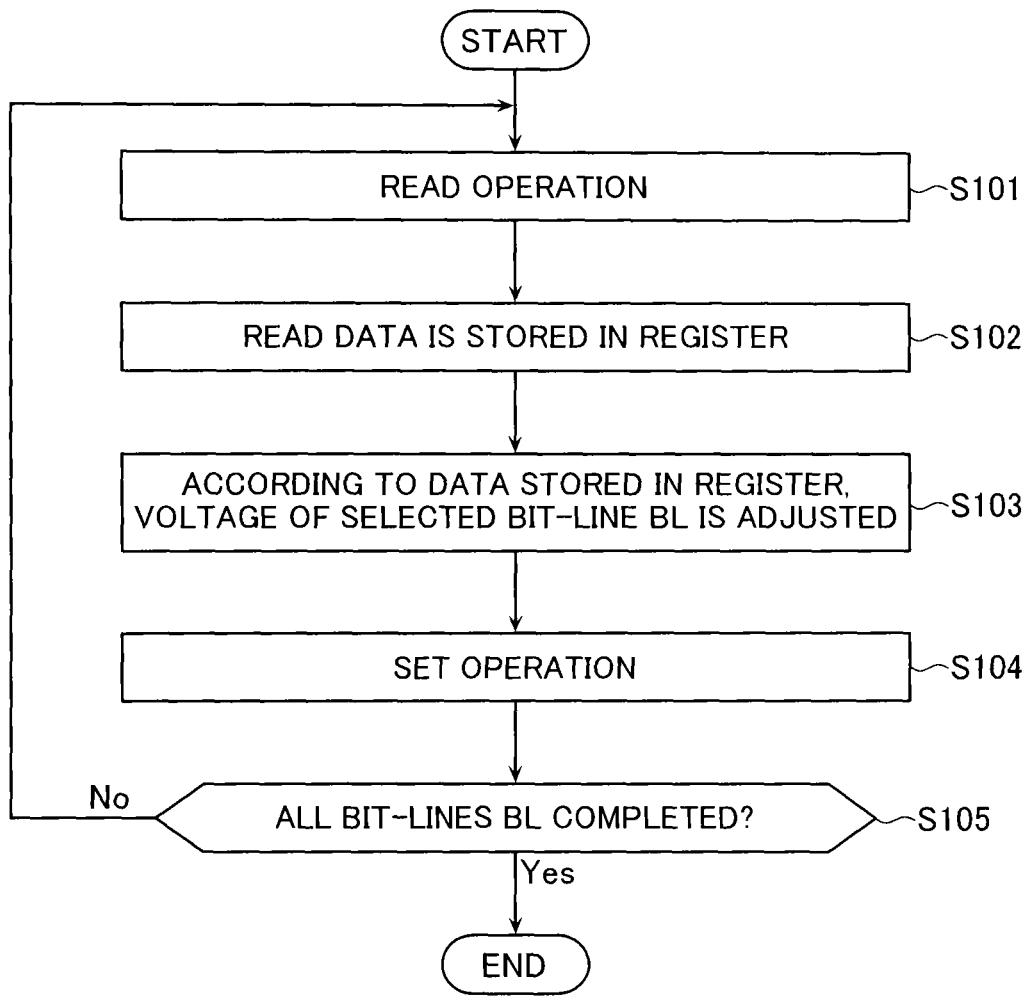
FIG. 8C is an example timing chart showing a read operation according to a modified example of the first embodiment.

As described above, the first embodiment performs the read operation to sense the voltage of the selected bit-line BL, the voltage changing according to the current flowing from the selected bit-line BL to the word-lines WL via the variable resistance elements VR. Because data to the memory cells are random, in some cases, the number of the variable resistance elements VR in the low resistance state connected to the selected bit-line may be large, and in other cases, the number of the variable resistance elements VR in the high resistive state connected to the selected bit-line may be large. The first embodiment may determine whether, among all variable resistance elements VR connected to the selected bit-line BL, the number of the elements VR in the low resistive state is large, or the number of the elements VR in the high resistive state is large. Then, in the reset operation, the first embodiment adjusts, according to the sensed voltage of the selected bit-line BL, the voltage of the selected bit-line BL. Thus, the first embodiment may perform the reset operation correctly. Note that the first embodiment is applicable to the reset operation as well as the set operation (S104) as shown in FIG. 8C.

Second Embodiment

Figure 9A:
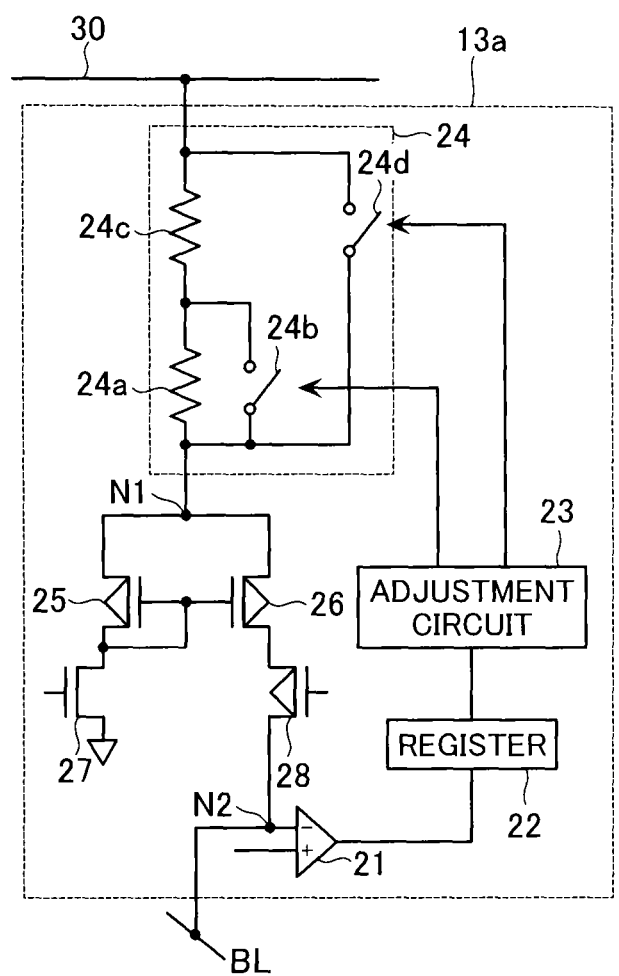
FIG. 9A is an example circuit diagram showing a selected bit-line voltage supply circuit 13a according to a second embodiment.

With reference now to FIG. 9A, a semiconductor memory device according to a second embodiment will be described. The voltage drop adjustment circuit 24 in the first embodiment adjusts the dropped voltage value and supplies two different voltages to the node N2. In contrast, the voltage drop adjustment circuit 24 in the second embodiment adjusts the dropped voltage value and supplies three different voltages to the node N2 (selected bit-line BL). With reference to FIG. 9A, therefore, the voltage drop adjustment circuit 24 includes resistors 24a and 24c, and switches 24b and 24d.

The resistors 24a and 24c are connected in series between the wiring line 30 and the node N. The switch 24b is connected in parallel with the resistor 24a and connected in series with the resistor 24c. The switch 24d is connected in parallel with the resistors 24a and 24c. The conduction states of the switches 24b and 24d are controlled by the adjustment circuit 23.

Figures 9B, 10A:
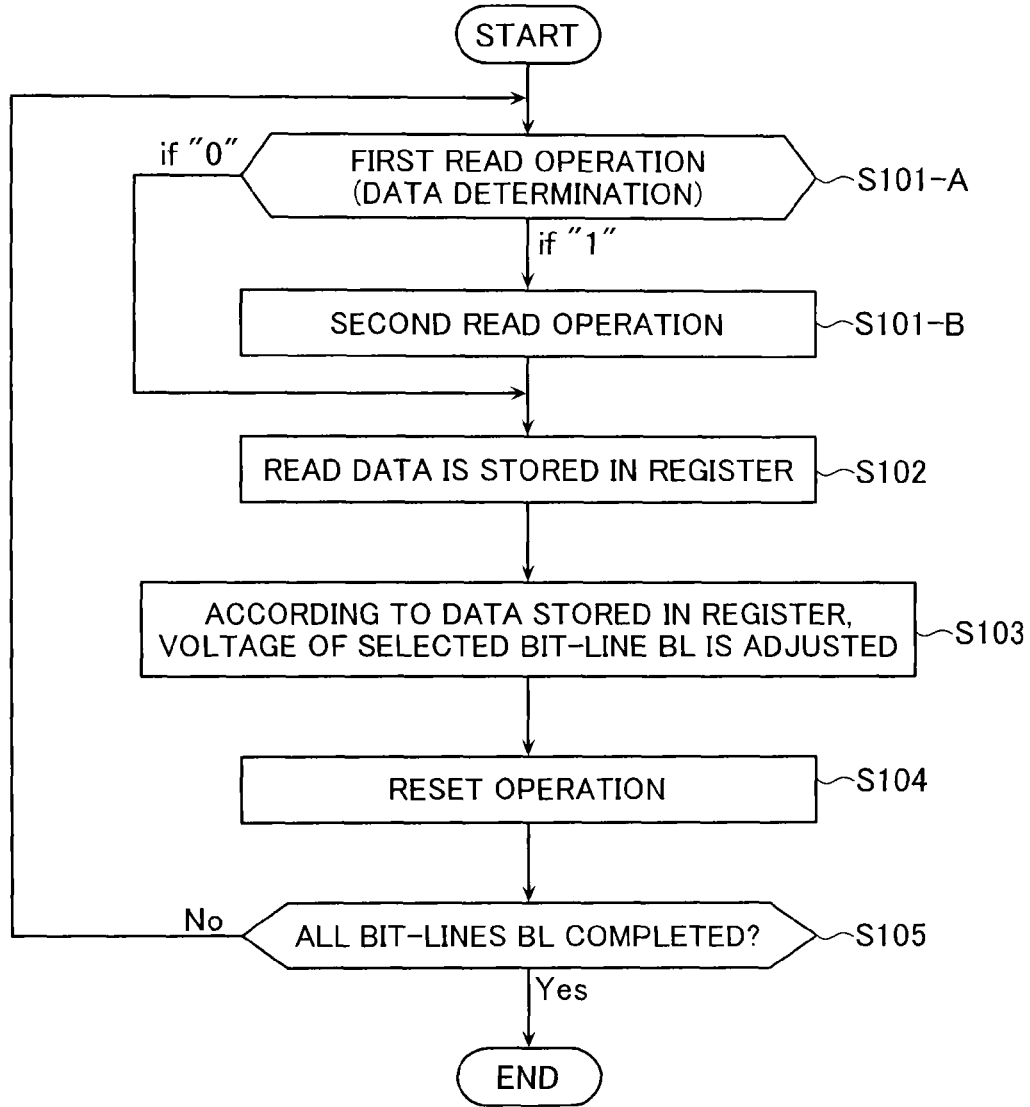
FIG. 9B is an example flowchart showing a read operation and a reset operation according to the second embodiment.
FIG. 10A is an example table showing the reset operation of the selected bit-line voltage supply circuit 13a according to the second embodiment.

With reference now to FIG. 9B, the read operation of the selected bit-line voltage supply circuit 13a according to the second embodiment will be described. With reference to FIG. 9B, the second embodiment performs two read operations, which is different from the first embodiment that performs only one reading. The first read operation (S101-A) sets the current I_ch supplied to the selected bit-line BL2 to, for example, 10 μA. The second read operation (S101-B) sets the current I_ch to a value, such as 30 μA, higher than in the first read operation. If the first read operation (S101-A) determines that "0" data is read (S101-A, if "0"), then the second read operation (S101-B) is omitted and the same step S102 as in the first embodiment is performed. Meanwhile, if the first read operation (S101-A) determines that "1" data is read (S101-A, if "1"), then the second read operation (S101-B) is performed and followed by step S102.

With reference now to FIG. 10A, the reset operation of the selected bit-line voltage supply circuit 13a according to the second embodiment will be described. With reference to "case 1" in FIG. 10A, if the first read operation (S101-A) determines that "0" data is read (S101-A, if "0"), then the current I_BL is considered to be below 10 μA regardless of the determination in the second read operation (S101-B). In this case, the switches 24b and 24d turn off (OFF). Thus, the voltage drop adjustment circuit 24 drops the voltage of the wiring line 30 with the resistors 24a and 24c and supplies the dropped voltage to the node N2.

With reference to "case 2" in FIG. 10A, if the first read operation (S101-A) determines that "1" data is read (S101-A, if "1") and the second read operation (S101-B) determines that "0" data is read, then the current I_BL is considered to be 10 to 30 μA. In this case, only the switch 24b turns on (ON). Thus, the voltage drop adjustment circuit 24 drops the voltage of the wiring line 30 with the resistor 24c and supplies the dropped voltage to the node N2. With reference to "case 3" in FIG. 10A, if the first read operation (S101-A) determines that "1" data is read (S101-A, if "1") and the second read operation (S101-B) determines that "1" data is read, then the current I_BL is considered to be above 30 μA. In this case, only the switch 24d turns on (ON). Thus, the voltage drop adjustment circuit 24 supplies the voltage of the wiring line 30 to the node N2 without dropping the voltage.

Figure 10B:
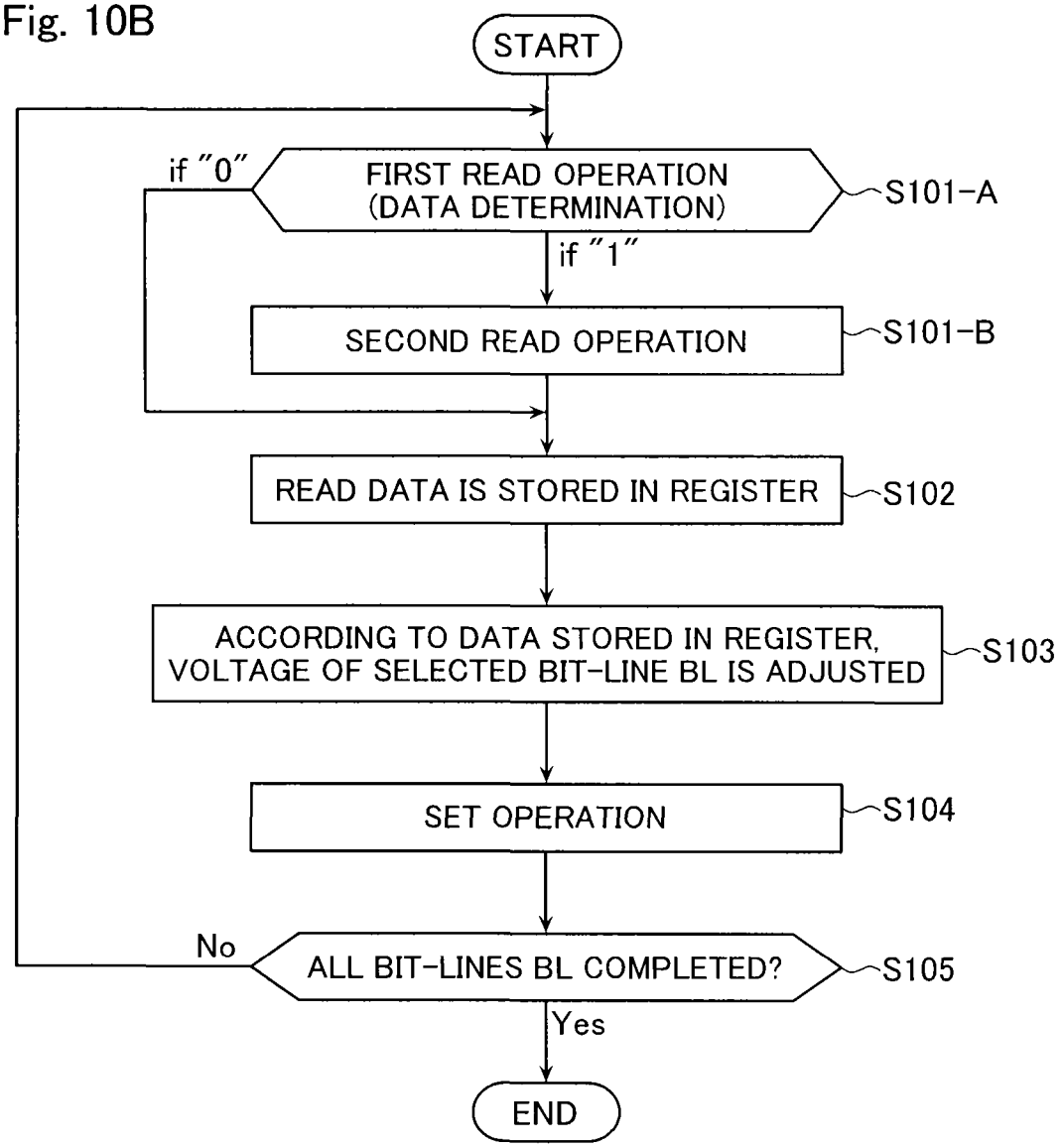
FIG. 10B is an example flowchart showing a read operation and a reset operation according to a modified example of the second embodiment.

As described above, the second embodiment has a similar advantage to the first embodiment. In addition, the second embodiment may adjust, in the reset operation, the voltage supplied to the selected bit-line BL2 finely. In addition, the second embodiment may perform, if the first read operation (S101-A) determines that the current I_BL is low, the read operation rapidly by omitting the second read operation (S101-B). Note that the second embodiment is applicable to the reset operation as well as the set operation (S104) as shown in FIG. 10B.

Third Embodiment

Figure 11:
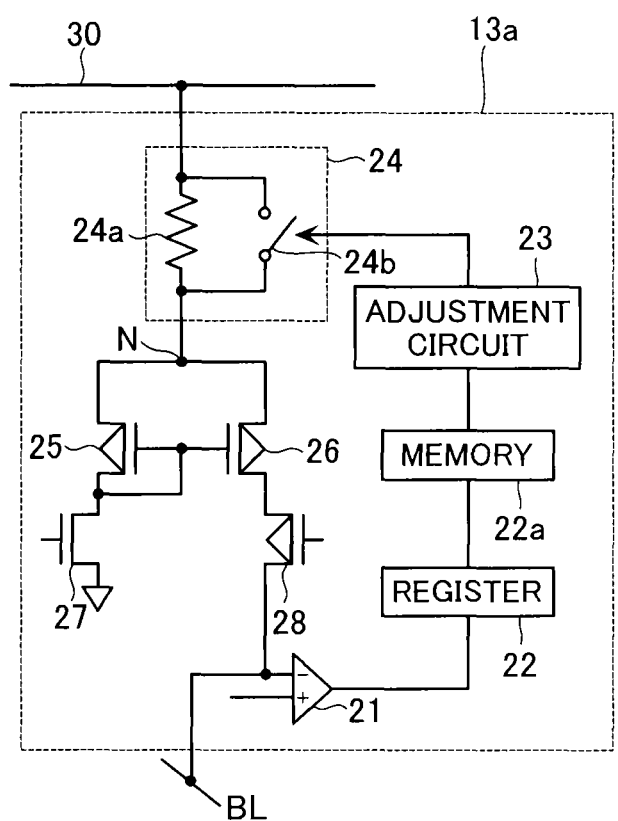
FIG. 11 is an example circuit diagram showing a selected bit-line voltage supply circuit 13a according to a third embodiment.

With reference now to FIG. 11, a semiconductor memory device according to a third embodiment will be described. With reference to FIG. 11, the selected bit-line voltage supply circuit 13a according to the third embodiment includes a memory 22a unlike that in the first embodiment. The memory 22a stores data output from the sense amplifier 21 via the register 22. Note that the memory 22a may be volatile or non-volatile.

Figure 12A:
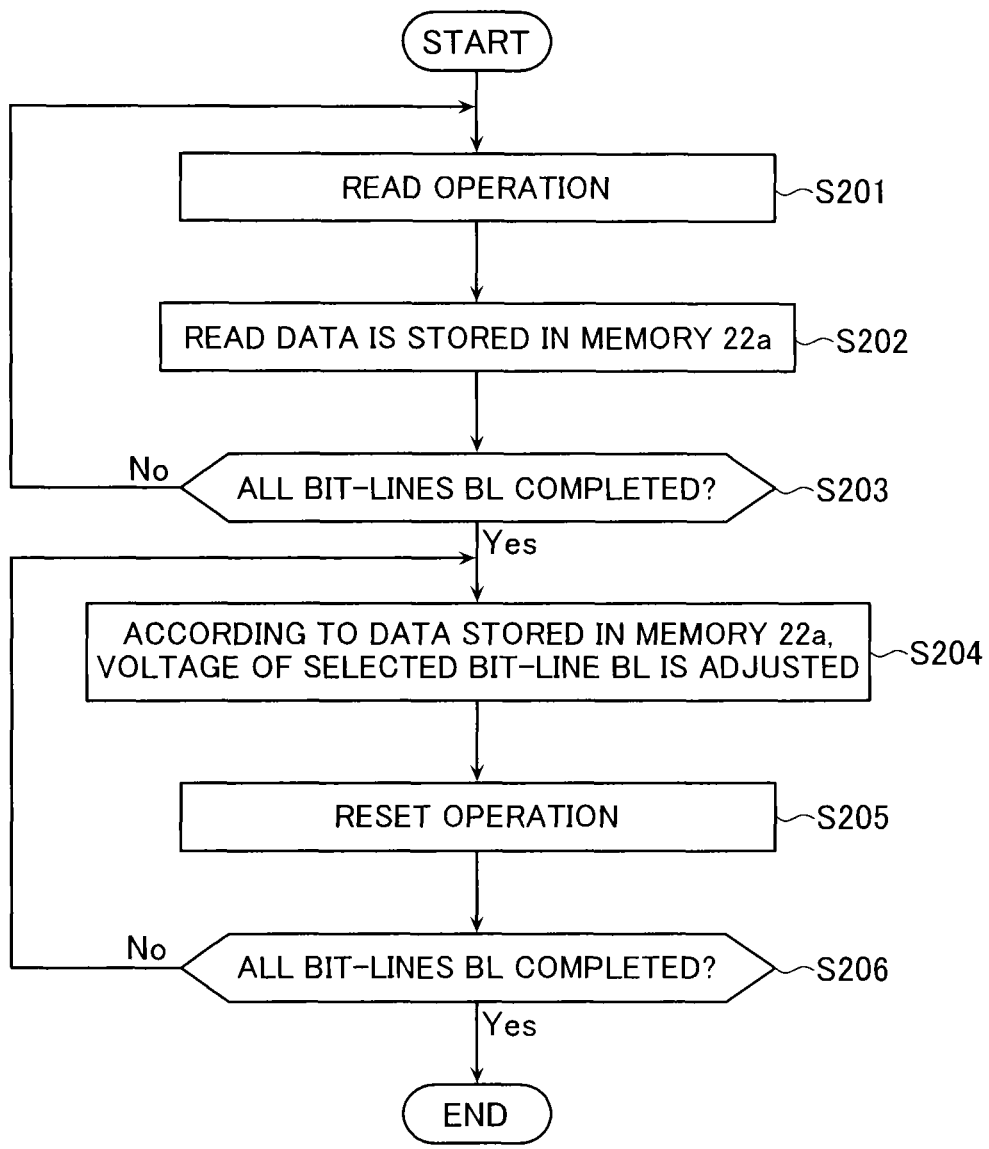
FIG. 12A is an example timing chart showing a read operation according to the third embodiment.

With reference now to FIG. 12A, a series of operations comprising the read operation and the reset operation according to the third embodiment will be described. First, the read operation senses the voltage of the selected bit-line BL (S201). Then, the read data is stored in the memory 22a via the register 22 (S202). Then, it is determined whether the processes of step S201 and S202 are completed to all bit-lines BL in the memory cell array 11 (S203). If the processes of step S201 and S202 are not completed yet to all bit-lines BL (S203, No), then the process of step S201 is performed again. Meanwhile, if the processes of step S201 and S202 are completed to all bit-lines BL (S203, Yes), then the process of step S204 is performed.

Figure 12B:
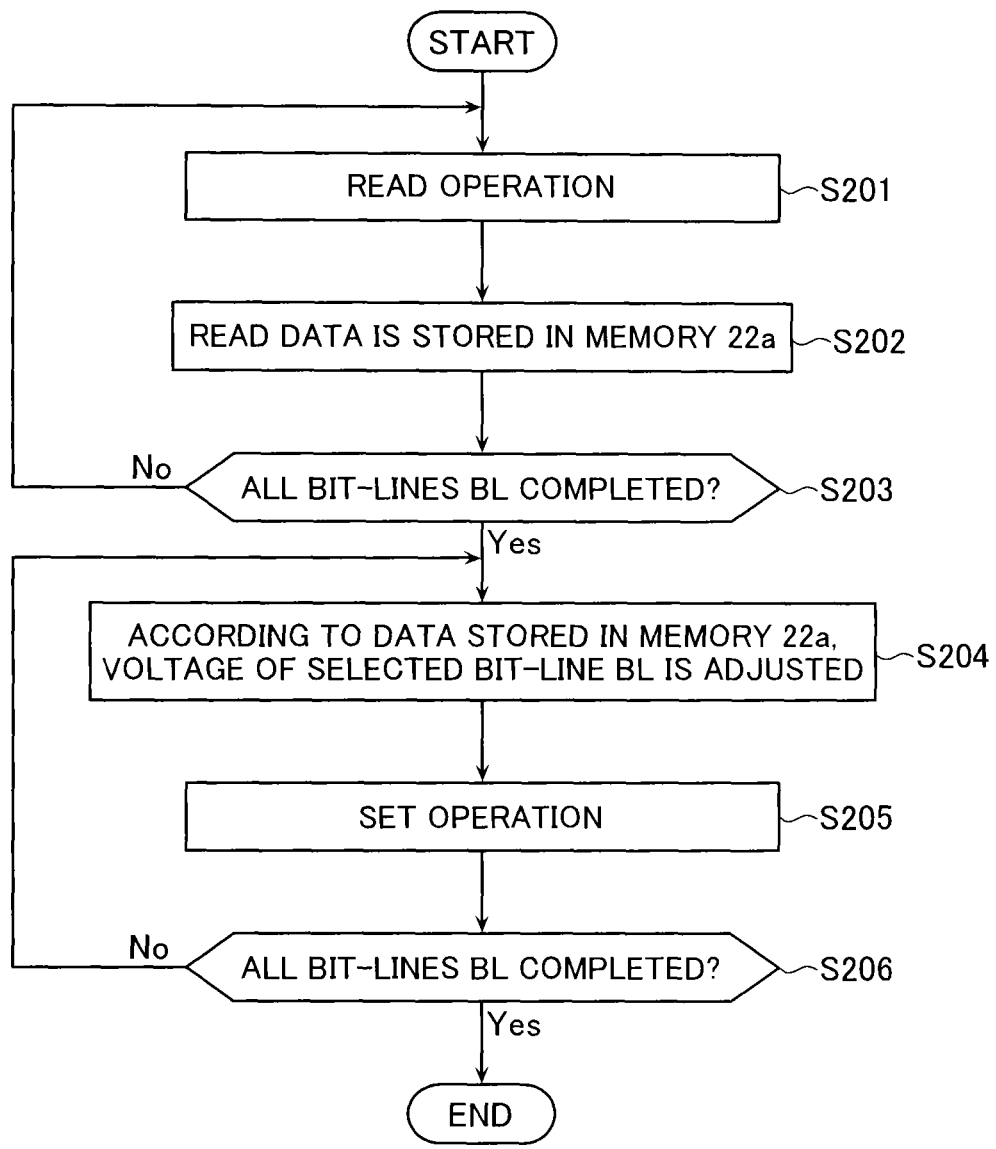
FIG. 12B is an example timing chart showing a read operation according to a modified example of the third embodiment.

In step S204, according to data stored in the memory 22a, the voltage of the selected bit-line BL is adjusted. Then, according to data stored in the memory 22a, the reset operation is performed (S205). Then, it is determined whether the processes of step S204 and S205 are completed to all bit-lines BL in the memory cell array 11 (S206). If the processes of step S204 and S205 are completed to all bit-lines BL (S206, Yes), the operation is ended. Meanwhile, if the processes of step S204 and S205 are not completed yet to all bit-lines BL (S206, No), the process of step S204 is performed again. In addition, the third embodiment may use the memory 22a to perform the reset operation after performing a plurality of read operations. In the first and second embodiments, the read and reset operations are alternately performed for each bit-line BL1. Thus, the setting of the voltage of the power supply 31 and the setting of the current through the mirror circuit are switched between for the read operation and for the reset operation. Thus, the operation time is increased. Meanwhile, the third embodiment previously performs the read operation to all bit-lines BL and stores the result in the memory 22a, and thus has an advantage of reducing the setting switching time between the read operation and the reset operation. Note that the third embodiment is applicable to the reset operation as well as the set operation (S205) as shown in FIG. 12B.

Fourth Embodiment

Figure 13:
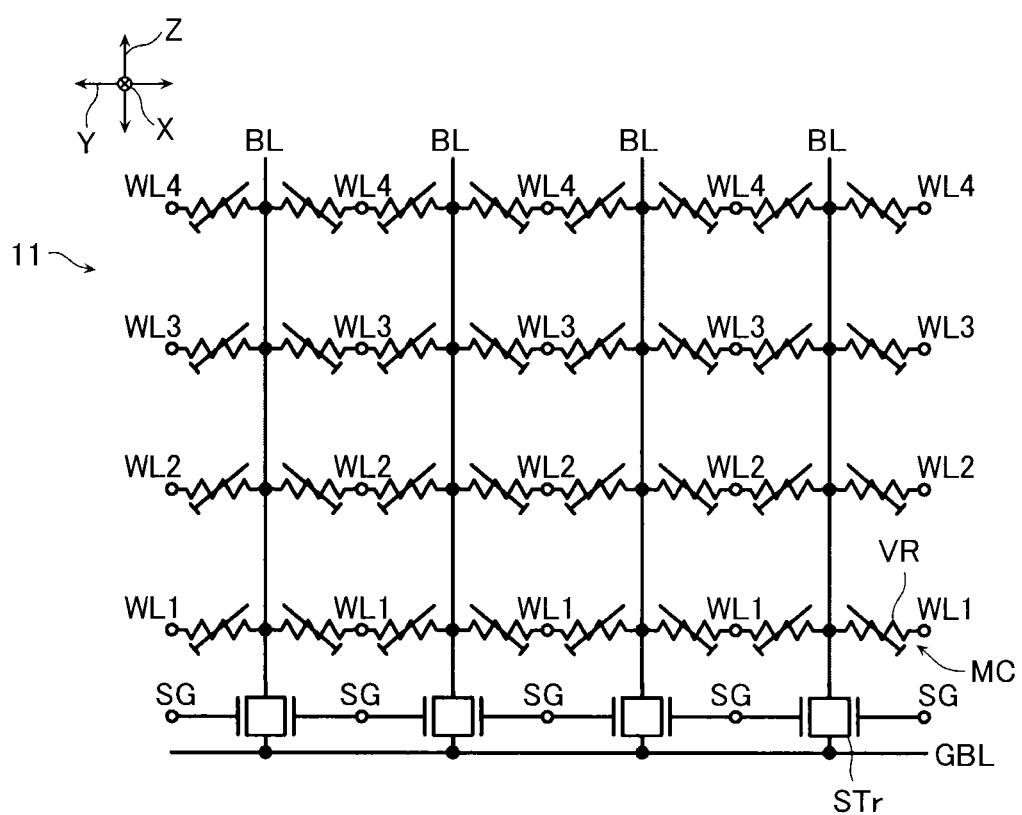
FIG. 13 is an example circuit diagram of a memory cell array 11 according to a fourth embodiment.
Figure 14:
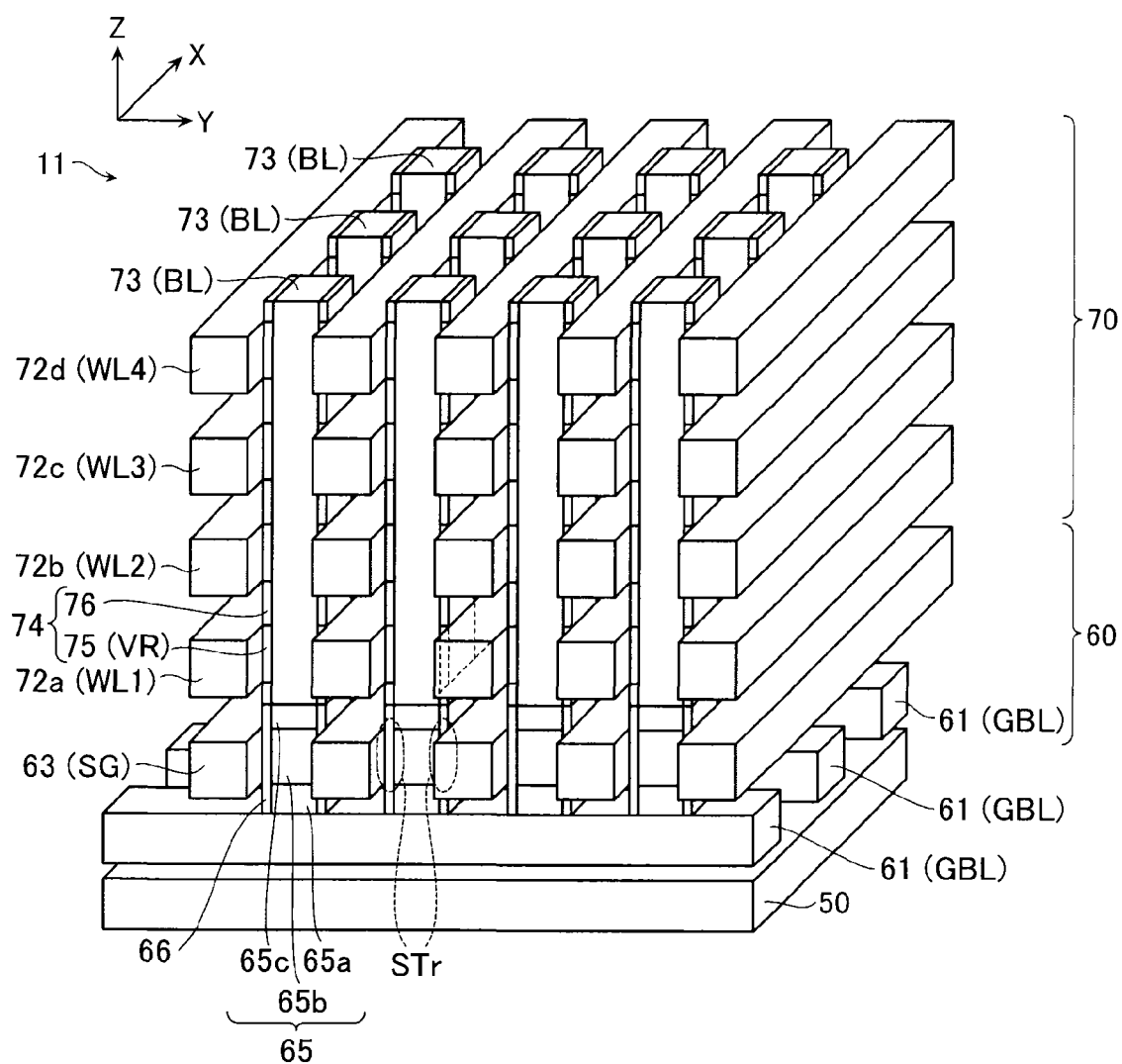
FIG. 14 is an example perspective view of a stacked structure of a memory cell array 11 according to the fourth embodiment.
Figure 15:
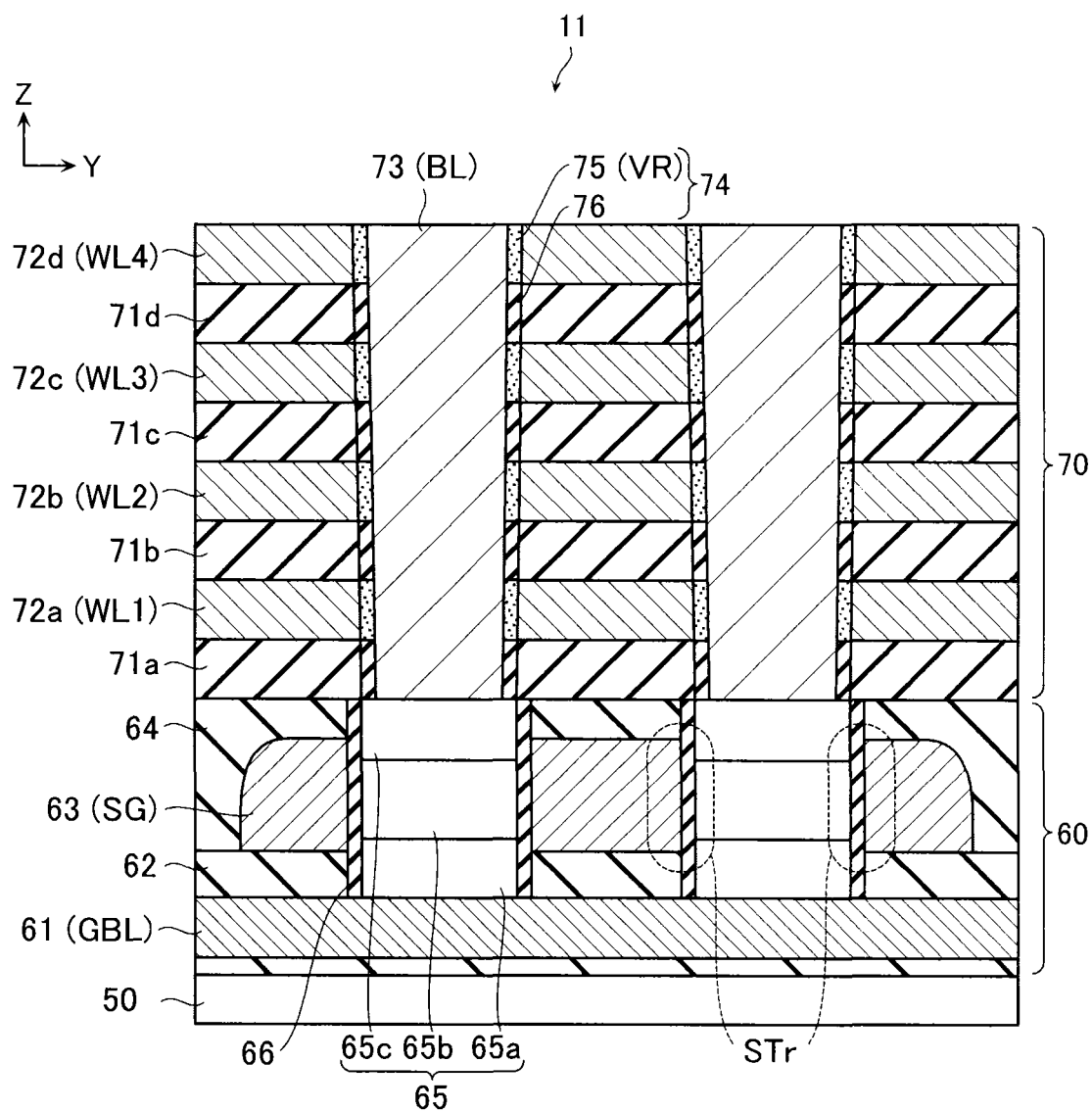
FIG. 15 is an example cross-sectional view of FIG. 14.

With reference now to FIG. 13 to FIG. 15, a semiconductor memory device according to a fourth embodiment will be described. With reference to FIGS. 13 to 15, the semiconductor memory device according to the fourth embodiment includes a memory cell array 11 different from that in the first embodiment. Note that the other configurations in the fourth embodiment are similar to those in the first embodiment, and thus their description is omitted here.

With reference first to FIG. 13, the circuitry of the memory cell array 11 according to the fourth embodiment will be described. FIG. 13 is an example circuit diagram of the memory cell array 11. Note that in FIG. 13, the X direction, the Y direction, and the Z direction are perpendicular to each other, and the X direction is a direction perpendicular to the plane. In addition, the structure shown in FIG. 13 is repeated in the X direction.

With reference to FIG. 13, the memory cell array 11 according to the fourth embodiment includes the word-lines WL, the bit-lines BL, and the memory cells MC, as well as select transistors STr, global bit-lines GBL, and select gate lines SG.

With reference to FIG. 13, the word-lines WL1 to WL4 are arranged in the Z direction and extend in the X direction. The bit-lines BL are arranged in a matrix in the X and Y directions and extend in the Z direction. The memory cells MC are disposed at the intersections of the word-lines WL and the bit-lines BL. Therefore, the memory cells MC are arranged in a three-dimensional matrix in the X, Y, and Z directions.

The memory cell array 11 according to this embodiment has lower sneak current than that in the first embodiment. Therefore, with reference to FIG. 13, each memory cell MC according to the fourth embodiment includes only a variable resistance element VR and no diode.

With reference to FIG. 13, the select transistors STr are provided between one ends of the bit-lines BL and one of the global bit-lines GBL. The global bit-lines GBL are arranged in the X direction and extend in the Y direction. One global bit-line GBL is commonly connected to one ends of the select transistors STr aligned in the Y direction. The select gate lines SG are arranged in the Y direction and extend in the X direction. One select gate line SG is commonly connected to the gates of the select transistors STr aligned in the X direction.

With reference now to FIG. 14 and FIG. 15, the stacked structure of the memory cell array 11 according to the fourth embodiment will be described. FIG. 14 is an example perspective view showing the stacked structure of the memory cell array 11. FIG. 15 is an example cross-sectional view of FIG. 14. Note that FIG. 14 omits the interlayer insulating layers.

With reference to FIGS. 14 and 15, the memory cell array 11 includes a substrate 50, a select transistor layer 60, and a memory layer 70, which are stacked on the substrate 50. The select transistor layer 60 has select transistors STr disposed thereon. The memory layer 70 has memory cells MC disposed therein.

With reference to FIGS. 14 and 15, the select transistor layer 60 includes, in the Z direction perpendicular to the principal plane of the substrate 50, a stack of conductive layers 61, interlayer insulating layers 62, conductive layers 63, and interlayer insulating layers 64. The conductive layers 61 function as the global bit-lines GBL. The conductive layers 63 function as the select gate lines SG and the gates of the select transistors STr.

The conductive layers 61 are arranged in the X direction parallel to the principal plane of the substrate 50 at a predetermined pitch and extend in the Y direction. The interlayer insulating layers 62 cover the upper surfaces of the conductive layers 61. The conductive layers 63 are arranged in the Y direction at a predetermined pitch and extend in the X direction. The interlayer insulating layers cover side surfaces and the upper surfaces of the conductive layers 63. The conductive layers 61 and 63 are made of, for example, polysilicon. The interlayer insulating layers 62 and 64 are made of, for example, silicon dioxide ($SiO_2$).

With reference to FIGS. 14 and 15, the select transistor layer 60 also includes columnar semiconductor layers 65 and gate insulating layers 66. The columnar semiconductor layers 65 function as the bodies (channels) of the select transistors STr. The gate insulating layers 66 function as the gate-insulating films of the select transistors STr.

The columnar semiconductor layers 65 are disposed in a matrix in the X and Y directions and extend in a columnar shape in the Z direction. In addition, the columnar semiconductor layers 65 are in contact with the upper surfaces of the conductive layers 61 and also in contact with the side surfaces of the Y-direction end portions of the conductive layers 63 via the gate insulating layers 66. Then, each columnar semiconductor layer 65 includes, for example, a stack of an N+type semiconductor layer 65a, a P+type semiconductor layer 65b, and an N+type semiconductor layer 65c.

With reference to FIGS. 14 and 15, the N+type semiconductor layer 65a is in contact, on the side surfaces of its Y-direction end portions, with the interlayer insulating layers 62. The P+type semiconductor layer 65b is in contact, on the side surfaces of its Y-direction end portions, with side surfaces of the conductive layers 63. The N+type semiconductor layer 65c is in contact, on the side surfaces of its Y-direction end portions, with the interlayer insulating layers 64. The N+type semiconductor layers 65a and 65c are made of polysilicon having an N+type impurity implanted therein. The P+type semiconductor layer 65b is made of polysilicon having a P+type impurity implanted therein. The gate insulating layers 66 are made of, for example, silicon dioxide ($SiO_2$).

With reference to FIGS. 14 and 15, the memory layer 70 includes an alternate stack of interlayer insulating layers 71a to 71d and conductive layers 72a to 72d in the Z direction. The conductive layers 72a to 72d function as the word-lines WL1 to WL4.

Each of the conductive layers 72a to 72d has a pair of comb shapes opposite in the X direction. The interlayer insulating layers 71a to 71d are made of, for example, silicon dioxide ($SiO_2$). The conductive layers 72a to 72d are made of, for example, polysilicon.

With reference to FIGS. 14 and 15, the memory layer 70 also includes column conductive layers 73 and side wall layers 74. The column conductive layers 73 are disposed in a matrix in the X and Y directions. The column conductive layers 73 are in contact with the upper surfaces of the columnar semiconductor layers 65 and extend in a columnar shape in the Z direction. The column conductive layers 73 function as the bit-lines BL.

The side wall layers 74 are provided on the side surfaces of the Y-direction end portions of the column conductive layers 73. With reference to FIGS. 14 and 15, each side wall layer 74 includes a variable resistance layer 75 and an oxidation layer 76. The variable resistance layers 75 function as the variable resistance elements VR. The oxidation layers 76 have lower conductivity than the variable resistance layers 75.

The variable resistance layers 75 are provided between the column conductive layers 73 and the side surfaces of the Y-direction end portions of the conductive layers 72a to 72d. The oxidation layers 76 are provided between the column conductive layers 73 and the side surfaces of the Y-direction end portions of the interlayer insulating layers 71a to 71d.

The column conductive layers 73 are made of, for example, polysilicon. The side wall layers 74 (the variable resistance layers 75 and the oxidation layers 76) are made of, for example, metal oxide. More specifically, the variable resistance layers 75 are made of materials containing less oxygen than the stoichiometric amount, such as $HfO_x$, $Al_2O_x$, $TiO_x$, $NiO_x$, $WO_x$, and $Ta_2O_x$. The oxidation layers 76 are made of materials containing stoichiometric oxygen, such as $HfO_2$, $Al_2O_3$, $TiO_2$, $NiO$, $WO_3$, and $Ta_2O_5$.

Others

While some embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

For example, in the above embodiments, one read operation senses the voltage of the selected bit-line BL, the voltage changing according to the current flowing from the selected bit-line BL to all word-lines WL via the variable resistance elements VR. However, one read operation may sense the voltage of the selected bit-line BL, the voltage changing according to the current flowing from the selected bit-line BL to one selected word-line WL via a variable resistance element VR. In this case, different selected word-lines WL may be selected to sense the voltage of the selected bit-line BL plural times.

Figure 16A:
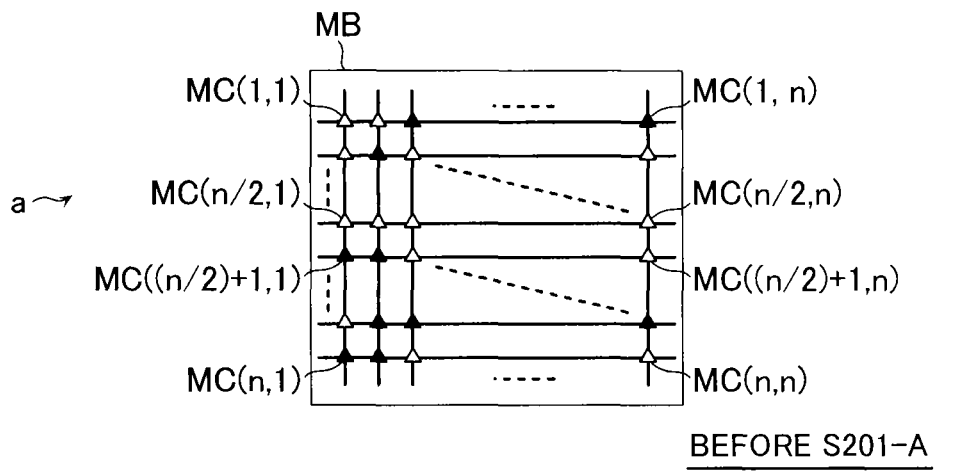
FIG. 16A is an example schematic diagram of a read operation according to another embodiment.
Figure 16A:
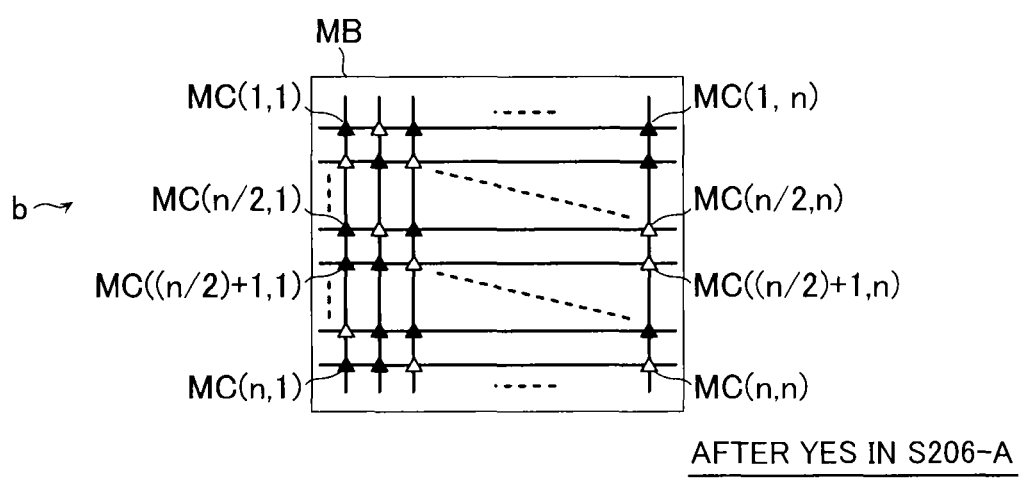
Figure 16B:
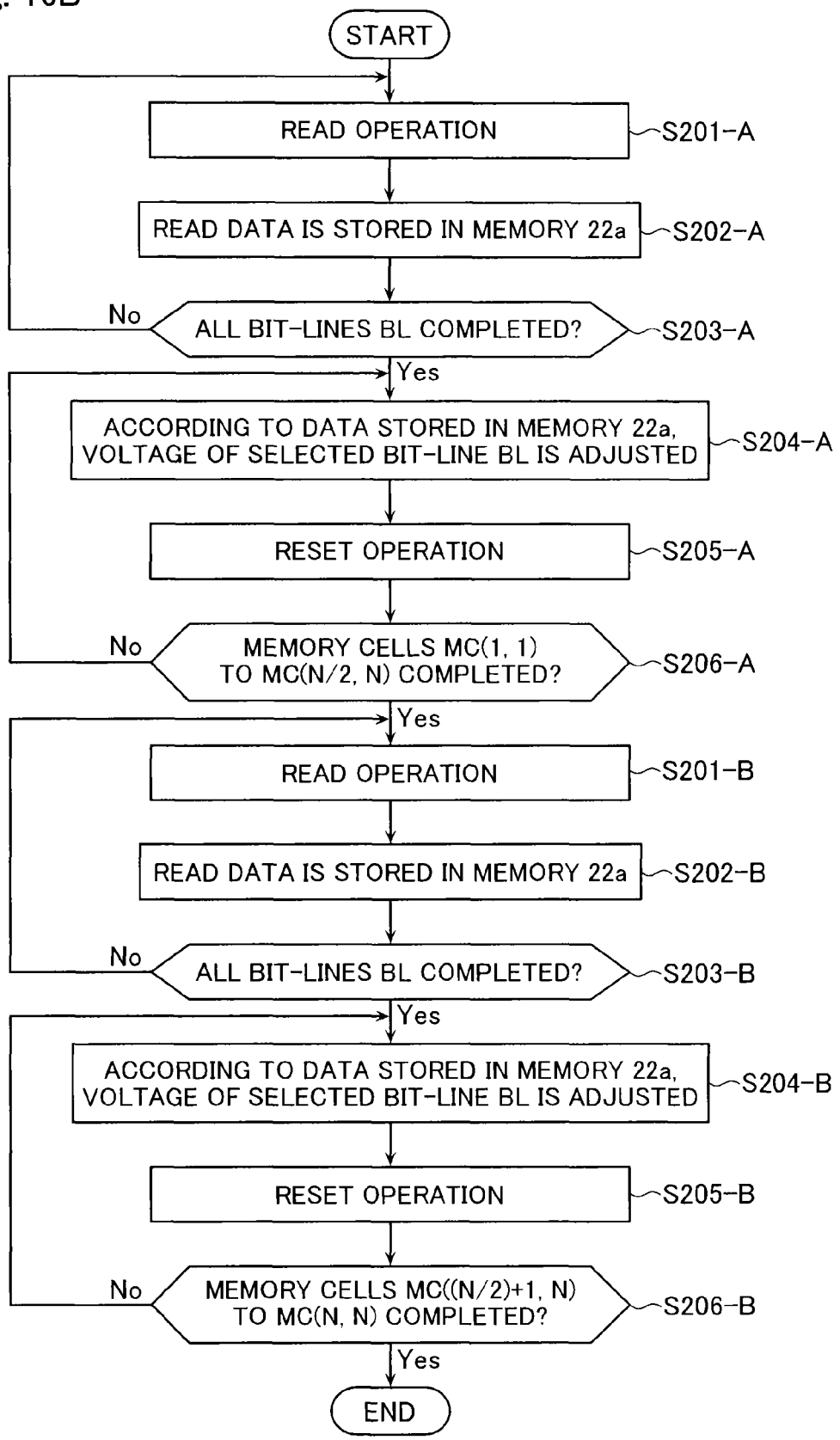
FIG. 16B is an example flowchart showing a read operation and a reset operation according to another embodiment.

The read operation and the reset operation may also be performed as shown in FIG. 16A and FIG. 16B. First, the resistive state of the variable resistance element VR before the first read operation is like "a" in FIG. 16A. In this state, the voltage of the bit-line BL is read (first read operation: S201-A in FIG. 16B) before performing the reset operation. Then, processes that are generally the same as S202 to S205 in the third embodiment are used to perform the reset operation to a half of the memory cells MC (1, 1) to MC ((n/2), n) (S202-A to S206-A in FIG. 16B). Here, the reset operation controls, according to data in the first read operation, the voltage of the selected bit-line BL (S204-A). In addition, an operation (reset operation) is performed at the same time that changes the variable resistance element VR from the low resistive state to the high resistive state (S205-A). Specifically, the selected bit-line BL is applied with a voltage when, like the memory cells MC (1, 1) and MC (1, 2), the resistive state of the variable resistance element VR is changed. Then, the adjustment circuit 23 adjusts the voltage of the selected bit-line BL (S204-A). Meanwhile, the bit-line BL is non-selected when, like the memory cells MC (1, 3) and MC (1, n), the resistive state of the variable resistance element VR is not changed.

As a result, the resistive state of the variable resistance element VR is like "b" in FIG. 16A after the reset operation is performed to a half of the memory cells MC (1, 1) to MC ((n/2), n). Here, in "a" and "b" in FIG. 16A, the resistive states of the variable resistance elements VR connected to the respective bit-lines BL may be often changed. Then, after the reset operation is performed to a half of the memory cells MC (1, n) to MC (n/2, n) in the memory block MB, the voltages of the bit-lines BL are read (second read operation: S201-B in FIG. 16B). Specifically, after the resistive state of a memory cell MC in the memory block MB has changed from "a" in FIG. 16A, it is determined again whether, among all variable resistance elements VR connected to the selected bit-line BL, the number of the elements VR in the low resistive state is large, or the number of the elements VR in the high resistance state is large. Then, processes that are generally the same as S202 to S205 in the third embodiment are used to perform the reset operation to the remaining half of the memory cells MC ((n/2)+1, n) to MC (n, n) (S202-B to S206-B in FIG. 16B). Here, according to data in the second read operation, the adjustment circuit 23 controls the voltage of the selected bit-line BL (S204-B).

Figure 16C:
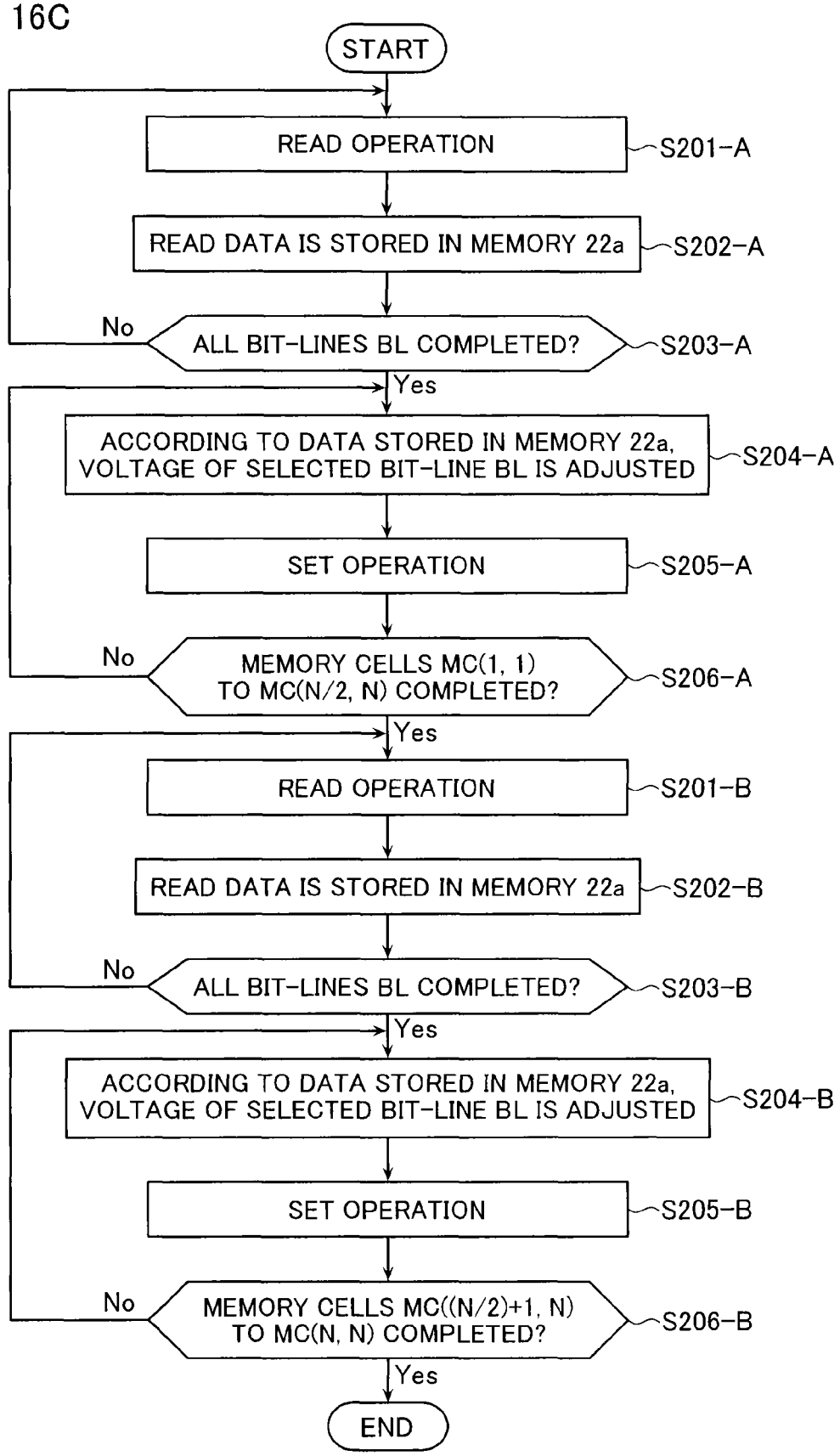
FIG. 16C is an example flowchart showing a read operation and a reset operation according to another embodiment.

Therefore, even if the reset operation changes the resistive state of the variable resistance element VR in the memory block MB, the resistance of the variable resistance elements may be changed correctly by dividing the memory cells MC in the memory block MB and performing the read operation thereto. Note that the embodiment shown in FIGS. 16A and 16B is applicable to the reset operation as well as the set operation (S205A, S205B) as shown in FIG. 16C.

Figure 17:
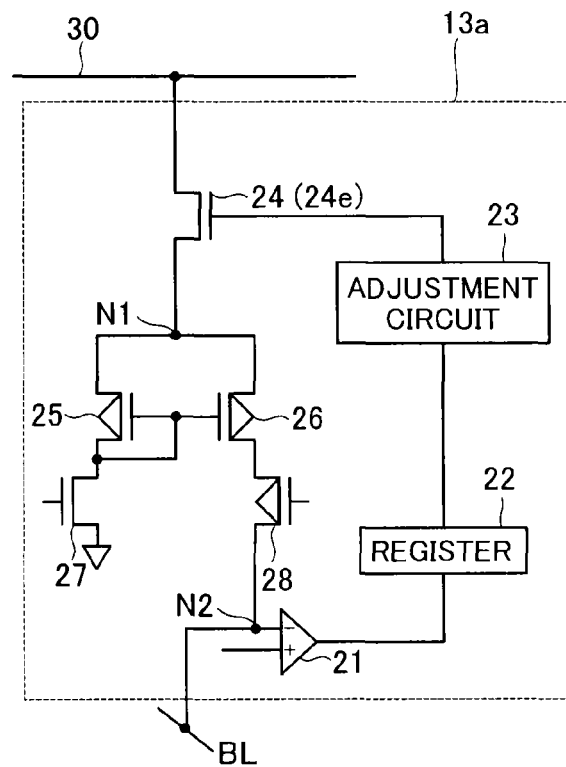
FIG. 17 is an example circuit diagram showing a selected bit-line voltage supply circuit 13a according to another embodiment.

For example, with reference to FIG. 17, the voltage drop adjustment circuit 24 may include an NMOS transistor 24e.

Figure 18:
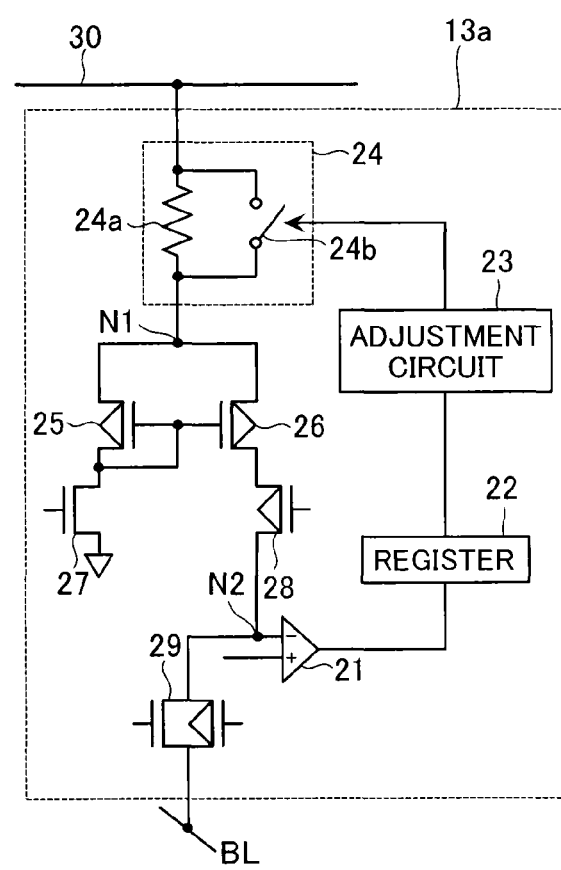
FIG. 18 is an example circuit diagram showing a selected bit-line voltage supply circuit 13a according to another embodiment.

The NMOS transistor 24e is connected between the wiring line 30 and the node N1. The NMOS transistor 24e has a gate connected to the adjustment circuit 23. In addition, with reference to FIG. 18, a clamp transistor 29 may be connected between the inverting input terminal (node N2) of the sense amplifier 21 and the bit-line BL.

What is claimed is:

1. A semiconductor memory device comprising:
   a memory cell array comprising a plurality of memory cells disposed at intersections of a plurality of first wiring lines and a plurality of second wiring lines, each memory cell comprising a variable resistance element; and
   a control circuit configured to perform, when a plurality of variable resistance elements connected to a selected first wiring line are selected, a read operation to sense a voltage of the selected first wiring line, and adjust, according to the voltage of the selected first wiring line sensed in the read operation, a voltage to be applied to the selected first wiring line in a reset operation or a set operation,
   the reset operation being an operation to increase resistance of the variable resistance element, and
   the set operation being an operation to decrease resistance of the variable resistance element.

2. The semiconductor memory device according to claim 1, wherein
   the control circuit is configured to cause, in the read operation, current to flow from the selected first wiring line to a plurality of second wiring lines at the same time via a plurality of variable resistance elements.

3. The semiconductor memory device according to claim 1, wherein
   the control circuit is configured to apply, in the read operation, a potential difference between the selected first wiring line and at least one of the plurality of a second wiring lines.

4. The semiconductor memory device according to claim 1, wherein
   the control circuit comprises:
   a sense amplifier configured to compare a voltage of the selected first wiring line and a reference voltage; and
   a voltage drop adjustment circuit configured to drop, in the reset or set operation, a voltage supplied to the selected first wiring line according to data output from the sense amplifier.

5. The semiconductor memory device according to claim 4, wherein
   the control circuit further comprises a current mirror circuit provided between the voltage drop adjustment circuit and the selected first wiring line.

6. The semiconductor memory device according to claim 4, wherein
   the voltage drop adjustment circuit comprises:
   a resistor; and
   a switch connected in parallel with the resistor, the conduction state of the switch is controlled according to data output from the sense amplifier.

7. The semiconductor memory device according to claim 4, wherein
   the voltage drop adjustment circuit comprises:
   a first resistor and a second resistor connected in series;
   a first switch connected in parallel with the first resistor and connected in series with the second resistor; and
   a second switch connected in parallel with the first and second resistors, the conduction states of the first and second switches are controlled according to data output from the comparator.

8. The semiconductor memory device according to claim 5, wherein
the control circuit is configured to perform the read operation to the selected first wiring line plural times, and
the current mirror circuit is configured to cause different current to flow at each read operation.

9. the semiconductor memory device according to claim 4, wherein
the voltage drop adjustment circuit comprises a transistor, and
the gate voltage of the transistor is controlled according to data output from the sense amplifier.

10. The semiconductor memory device according to claim 4, wherein
the voltage drop adjustment circuit further comprises a register configured to store data output from the sense amplifier.

11. The semiconductor memory device according to claim 4, wherein
the voltage drop adjustment circuit further comprises a memory storing data output from the sense amplifier.

12. The semiconductor memory device according to claim 1, wherein
the control circuit is configured to perform the read operation each time the reset or set operation is performed to a first number of memory cells.

13. The semiconductor memory device according to claim 1, wherein
the control circuit is configured to perform, after the read operation is performed plural times, the reset or set operation.

14. The semiconductor memory device according to claim 1, wherein
the memory cell comprises a diode connected in series with the variable resistance element, and
the control circuit is configured to apply, in the read operation, a voltage to the selected first wiring line and the second wiring lines to conduct current in the forward direction of the diode.

15. The semiconductor memory device according to claim 1, wherein
the first wiring lines and the second wiring lines extend in a direction parallel to a principal plane of a substrate, and
memory cells arranged in a direction perpendicular to the substrate share the first wiring lines.

16. The semiconductor memory device according to claim 1, wherein
the first wiring lines extend in a direction perpendicular to a principal plane of a substrate, and
the second wiring lines extend in a direction parallel to a principal plane of the substrate and are disposed in a direction perpendicular to the principal plane of the substrate.

* * * * *